(12) United States Patent
Nosaka et al.

(10) Patent No.: US 12,517,433 B2
(45) Date of Patent: Jan. 6, 2026

(54) COMPOSITION, RESIST UNDERLAYER FILM, METHOD OF FORMING FILM, METHOD OF PRODUCING PATTERNED SUBSTRATE, AND COMPOUND

(71) Applicant: JSR CORPORATION, Tokyo (JP)

(72) Inventors: Naoya Nosaka, Tokyo (JP); Tsubasa Abe, Tokyo (JP); Masato Dobashi, Tokyo (JP); Kazunori Takanashi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 669 days.

(21) Appl. No.: 17/689,193

(22) Filed: Mar. 8, 2022

(65) Prior Publication Data

US 2022/0197144 A1 Jun. 23, 2022

Related U.S. Application Data

(63) Continuation of application No. PCT/JP2020/034969, filed on Sep. 15, 2020.

(30) Foreign Application Priority Data

Sep. 17, 2019 (JP) ................................. 2019-168529

(51) Int. Cl.
| | | |
|---|---|---|
| *G03F 7/11* | (2006.01) | |
| *C07C 13/567* | (2006.01) | |
| *C07C 13/62* | (2006.01) | |
| *C07C 13/66* | (2006.01) | |
| *C07C 69/616* | (2006.01) | |
| *C07D 209/08* | (2006.01) | |
| *C07D 317/50* | (2006.01) | |
| *H01L 21/027* | (2006.01) | |

(52) U.S. Cl.
CPC ............. *G03F 7/11* (2013.01); *C07C 13/567* (2013.01); *C07C 13/62* (2013.01); *C07C 13/66* (2013.01); *C07C 69/616* (2013.01); *C07D 209/08* (2013.01); *C07D 317/50* (2013.01); *C07C 2603/18* (2017.05); *C07C 2603/50* (2017.05); *C07C 2603/54* (2017.05); *H01L 21/0273* (2013.01)

(58) Field of Classification Search
CPC . G03F 7/094; G03F 7/092; G03F 7/09; G03F 7/11; C07C 13/567; C07C 2603/54
See application file for complete search history.

(56) References Cited

U.S. PATENT DOCUMENTS 11,243,468 B2 2/2022 Nosaka et al.
2018/0356732 A1* 12/2018 Tokunaga ................. G03F 7/40
2020/0012193 A1 1/2020 Nosaka et al.

FOREIGN PATENT DOCUMENTS

JP 2004177668 A 6/2004
JP 2014-86427 * 5/2014 ............ H01L 51/50
WO WO-2011108365 A1 9/2011
(Continued)

OTHER PUBLICATIONS

English Translation of Japanese Patent Publication No. 2014-86427 (Year: 2014).*
"Cross Linking of Gold Nanoparticles with Hexa-peri-hexabenzocoronene Derivatives", Vajiravelu et al., Journal of Nanoscience and Nanotechnology, 2009, vol. 9, pp. 6587-6593. (Year: 2009).*
Combined Taiwanese Office Action and Search Report issued Aug. 29, 2023 in Patent Application No. 109131787 (with English translation), 17 pages.
(Continued)

*Primary Examiner* — Daborah Chacko-Davis
(74) *Attorney, Agent, or Firm* — Element IP, PLC

(57) ABSTRACT

A composition includes: a compound including an aromatic hydrocarbon ring structure, and a partial structure represented by formula (1) which bonds to the aromatic hydrocarbon ring structure; and a solvent. The aromatic hydrocarbon ring structure has no fewer than 25 carbon atoms. In the formula (1), X represents a group represented by formula (i), (ii), (iii), or (iv); and *'s denote binding sites to two adjacent carbon atoms constituting the aromatic hydrocarbon ring structure. A method of producing a patterned substrate, includes applying the composition directly or indirectly on a substrate to form a resist underlayer film; forming a resist pattern directly or indirectly on the resist underlayer film; and carrying out etching using the resist pattern as a mask.

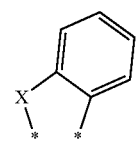

(1)

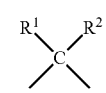

(i)

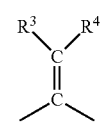

(ii)

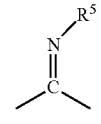

(iii)

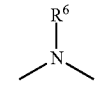

(iv)

12 Claims, No Drawings

(56) References Cited

FOREIGN PATENT DOCUMENTS

WO    WO-2018164267 A1    9/2018
WO    WO-2019208212 A1    10/2019

OTHER PUBLICATIONS

Office Action issued Jan. 30, 2024 in corresponding Japanese patent Application No. 2021-546921 (with machine-generated English translation), 11 pages.
International Search Report issued Dec. 8, 2020 in PCT/JP2020/034969 (with English translation), 9 pages.
Written Opinion issued Dec. 8, 2020 in PCT/JP2020/034969 (with English translation), 10 pages.
Office Action issued Jun. 11, 2024 in corresponding Japanese Patent Application No. 2021-546921 (with machine English translation), 4 pages.
Office Action issued Dec. 23, 2024, in corresponding Chinese Patent Application No. 202080061642.6 (with machine English translation), 58 pages.
Search Report issued Dec. 23, 2024, in corresponding Chinese Patent Application No. 202080061642.6 (with English translation), 4 pages.
Office Action issued Oct. 4, 2024, in corresponding Korean Patent Application No. 10-2022-7008400 (with machine English translation), 13 pages.
English machine translation of the Office Action issued Jun. 25, 2025, received on Jul. 16, 2025, in corresponding Chinese Patent Application No. 202080061642.6, (with English translation), 54 pages.

\* cited by examiner

COMPOSITION, RESIST UNDERLAYER FILM, METHOD OF FORMING FILM, METHOD OF PRODUCING PATTERNED SUBSTRATE, AND COMPOUND

CROSS-REFERENCE TO RELATED APPLICATIONS

The present application is a continuation application of International Application No. PCT/JP2020/034969, filed Sep. 15, 2020, which claims priority to Japanese Patent Application No. 2019-168529 filed Sep. 17, 2019. The contents of these applications are incorporated herein by reference in their entirety.

BACKGROUND OF THE INVENTION

Field of the Invention

The present invention relates to a composition, a resist underlayer film, a method of forming a film, a method of producing a patterned substrate, and a compound.

Discussion of the Background

In manufacturing semiconductor devices, for example, a multilayer resist process has been employed in which a resist film laminated on a substrate via a resist underlayer film, e.g., an organic underlayer film or a silicon-containing film, is exposed and developed to form a resist pattern. In this process, the resist underlayer film is etched by using the resist pattern as a mask and etching is further carried out on the substrate using the resultant resist underlayer film pattern as a mask, whereby a desired pattern can be formed on the substrate, thereby enabling obtaining a patterned substrate (see Japanese Unexamined Patent Application, Publication No. 2004-177668).

With regard to a material used in a composition for forming such a resist underlayer film, various considerations have been carried out (see PCT International Publication No. 2011/108365).

SUMMARY OF THE INVENTION

According to an aspect of the present invention, a method of producing a patterned substrate includes: applying a resist-underlayer-film-forming composition directly or indirectly on a substrate to form a resist underlayer film; forming a resist pattern directly or indirectly on the resist underlayer film; and carrying out etching using the resist pattern as a mask. The resist-underlayer-film-forming composition includes: a compound including an aromatic hydrocarbon ring structure, and a partial structure represented by formula (1) which bonds to the aromatic hydrocarbon ring structure; and a solvent. The aromatic hydrocarbon ring structure has no fewer than 25 carbon atoms.

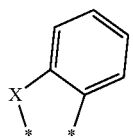

(1)

In the formula (1), X represents a group represented by formula (i), (ii), (iii), or (iv); and *'s denote binding sites to two adjacent carbon atoms constituting the aromatic hydrocarbon ring structure.

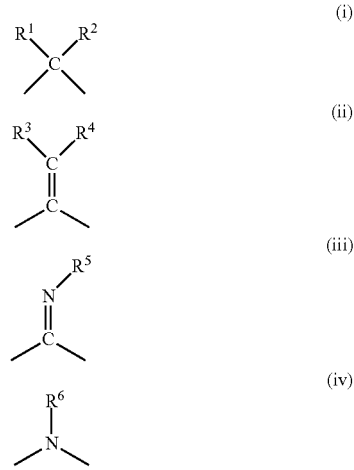

In the formula (i), $R^1$ represents a hydrogen atom or a monovalent organic group having 1 to 20 carbon atoms; and $R^2$ represents a monovalent organic group having 1 to 20 carbon atoms, in the formula (ii), $R^3$ represents a hydrogen atom or a monovalent organic group having 1 to 20 carbon atoms; and $R^4$ represents a monovalent organic group having 1 to 20 carbon atoms, in the formula (iii), $R^5$ represents a monovalent organic group having 1 to 20 carbon atoms, and in the formula (iv), $R^6$ represents a monovalent organic group having 1 to 20 carbon atoms.

According to another aspect of the present invention, a composition includes: a compound including an aromatic hydrocarbon ring structure, and a partial structure represented by formula (1) which bonds to the aromatic hydrocarbon ring structure; and a solvent. The aromatic hydrocarbon ring structure has no fewer than 25 carbon atoms.

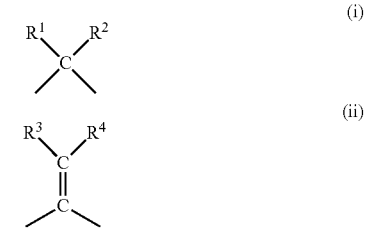

In the formula (1), X represents a group represented by formula (i), (ii), (iii), or (iv); and *'s denote binding sites to two adjacent carbon atoms constituting the aromatic hydrocarbon ring structure.

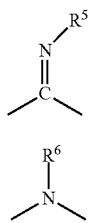

(iii)

(iv)

In the formula (i), $R^1$ represents a hydrogen atom or a monovalent organic group having 1 to 20 carbon atoms; and $R^2$ represents a monovalent organic group having 1 to 20 carbon atoms, in the formula (ii), $R^3$ represents a hydrogen atom or a monovalent organic group having 1 to 20 carbon atoms; and $R^4$ represents a monovalent organic group having 1 to 20 carbon atoms, in the formula (iii), $R^5$ represents a monovalent organic group having 1 to 20 carbon atoms, and in the formula (iv), $R^6$ represents a monovalent organic group having 1 to 20 carbon atoms.

According to a further aspect of the present on, a resist underlayer film is formed from the above-mentioned composition.

According to a further aspect of the present invention, a method of forming a film includes: applying the above-mentioned composition directly or indirectly on a substrate; and drying the composition.

According to a further aspect of the present invention, a compound includes: an aromatic hydrocarbon ring structure; and a partial structure represented by formula (2) which bonds to the aromatic hydrocarbon ring structure. The aromatic hydrocarbon ring structure has no fewer than 25 carbon atoms.

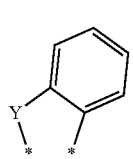

(2)

In the formula (2), Y represents a group represented by formula (v), (vi), (vii), or (viii); and *'s denote binding sites to two adjacent carbon atoms constituting the aromatic hydrocarbon ring structure.

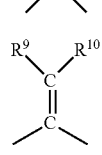

(v)

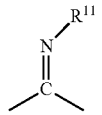

(vi)

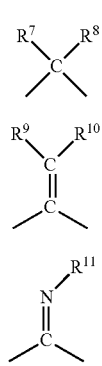

(vii)

(viii)

In the formula (v), $R^7$ and $R^8$ each independently represent a hydrogen atom or a monovalent organic group having 1 to 20 carbon atoms, in the formula (vi), $R^9$ and $R^{10}$ each independently represent a hydrogen atom or a monovalent organic group having 1 to 20 carbon atoms, in the formula (vii), $R^{11}$ represents a hydrogen atom or a monovalent organic group having 1 to 20 carbon atoms, and in the formula (viii), $R^{12}$ represents a hydrogen atom or a monovalent organic group having 1 to 20 carbon atoms.

DESCRIPTION OF EMBODIMENTS

In a multilayer resist process, etching resistance and heat resistance are required for an organic underlayer film as a resist underlayer film.

Recently, there have been increasing cases of forming a pattern on a substrate having multiple types of trenches, particularly trenches with aspect ratios that are different from one another. In these cases, a composition for forming a resist underlayer film is required to be capable of sufficiently embedding these trenches, i.e., to be superior in terms of an embedding property.

According to one embodiment of the invention, a composition contains: a compound (hereinafter, may be also referred to as "(A1) compound" or "compound (A1)") having an aromatic hydrocarbon ring structure, and a partial structure represented by the following formula (1); and a solvent (hereinafter, may be also referred to as "(B) solvent" or "solvent (B)"), wherein the aromatic hydrocarbon ring structure has no fewer than 25 carbon atoms,

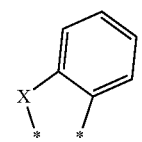

(1)

wherein, in the above formula (1), X represents a group represented by the following formula (i), (ii), (iii), or v); and *'s denote binding sites to two adjacent carbon atoms constituting the aromatic hydrocarbon ring structure,

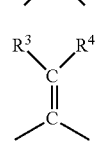

(i)

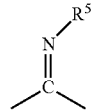

(ii)

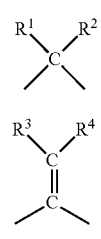

(iii)

(iv)

wherein,
in the formula (i), $R^1$ represents a hydrogen atom or a monovalent organic group having 1 to 20 carbon atoms; and $R^2$ represents a monovalent organic group having 1 to 20 carbon atoms,
in the formula (ii), $R^3$ represents a hydrogen atom or a monovalent organic group having 1 to 20 carbon atoms; and $R^4$ represents a monovalent organic group having 1 to 20 carbon atoms,
in the formula (iii), $R^5$ represents a monovalent organic group having 1 to 20 carbon atoms, and
in the formula (iv), $R^6$ represents a monovalent organic group having 1 to 20 carbon atoms.

An other embodiment of the invention is a resist underlayer film formed from the composition of the one embodiment of the present invention.

According to still another embodiment of the invention, a method of forming a resist underlayer film includes applying a resist-underlayer-film-forming composition directly or indirectly on a substrate, wherein the resist-underlayer-film-forming composition is the composition of the one embodiment of the present invention.

According to yet another embodiment of the invention, a method of producing a patterned substrate includes: applying a resist-underlayer-film-forming composition directly or indirectly on a substrate; forming a resist pattern directly or indirectly on a resist underlayer film formed by the applying; and carrying out etching using the resist pattern as a mask, wherein the resist-underlayer-film-forming composition is the composition of the one embodiment of the present invention.

A further embodiment of the invention is a compound (hereinafter, may be also referred to as "(A2) compound" or "compound (A2)") containing: an aromatic hydrocarbon ring structure; and a partial structure represented by the following formula (2), wherein the aromatic hydrocarbon ring structure has no fewer than 25 carbon atoms, (2)

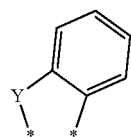

wherein, in the formula (2), Y represents a group represented by the following formula (v), (vi), (vii), or (viii); and *'s denote binding sites to two adjacent carbon atoms constituting the aromatic hydrocarbon ring structure, (v)

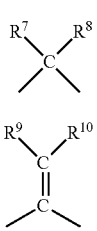

(vi)

(vii)

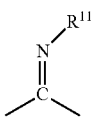

(viii)

wherein,
in the formula (v), $R^7$ and $R^8$ each independently represent a hydrogen atom or a monovalent organic group having 1 to 20 carbon atoms,
in the formula (vi), $R^9$ and $R^{10}$ each independently represent a hydrogen atom or a monovalent organic group having 1 to 20 carbon atoms,
in the formula (vii), $R^{11}$ represents a hydrogen atom or a monovalent organic group having 1 to 20 carbon atoms, and
in the formula (viii), $R^{12}$ represents a hydrogen atom or a monovalent organic group having 1 to 20 carbon atoms.

The composition of the one embodiment of the present invention enables forming a film being superior in terms of the etching resistance, the heat resistance, and the embedding property. The resist underlayer film of the other embodiment of the present invention is superior in terms of the etching resistance, the heat resistance, and the embedding property. The method of forming a resist underlayer film of the still another embodiment of the present invention enables forming a resist underlayer film being superior in terms of the etching resistance, the heat resistance, and the embedding property. Due to forming a resist pattern being superior in terms of the etching resistance, the heat resistance, and the embedding property, the method of producing a patterned substrate of the yet another embodiment of the present invention enables obtaining a favorable patterned substrate. The compound of the further embodiment of the present invention can be suitably used as a component of a composition for forming a resist underlayer film. Thus, these can be suitably used in manufacturing of a semiconductor device and the like, in which further progress of miniaturization is expected in the future.

Hereinafter, the composition, the resist underlayer film, the method of forming a resist underlayer film, the method of producing a patterned substrate, and the compound of embodiments of the present invention will be described in detail.

Composition

The composition of one embodiment of the present invention contains the compound (A1) and the solvent (B). The composition may contain, within a range not leading to impairment of the effects of the present invention, optional component(s).

Due to containing the compound (A1) and the solvent (B), the composition enables forming a film being superior in terms of the etching resistance, the heat resistance, and the embedding property. Thus, the composition can be used as a composition for forming a film. More specifically, the composition can be suitably used as a composition for forming a resist underlayer film in a multilayer resist process.

Each component contained in the composition is described below.

(A1) Compound

The compound (A1) is a compound having an aromatic hydrocarbon ring structure (hereinafter, may be also referred to as "aromatic hydrocarbon ring structure (I)"), and a partial structure (hereinafter, may be also referred to as "partial structure II") represented by the following formula (1), described below.

Aromatic Hydrocarbon Ring Structure (I)

The aromatic hydrocarbon ring structure (I) is an aromatic hydrocarbon ring structure having no fewer than 25 carbon atoms. As referred to herein, the "number of carbon atoms in the aromatic hydrocarbon ring structure (I)" means the number of carbon atoms constituting the ring structure of the aromatic hydrocarbon ring structure (I). The number of carbon atoms constituting the partial structure (II) is not included in the "number of carbon atoms in the aromatic hydrocarbon ring structure (I)."

The lower limit of the number of carbon atoms in the aromatic hydrocarbon ring structure (I) is 25, and is preferably 35, and more preferably 40. The upper limit of the number of carbon atoms is not particularly limited, and is, for example, 100. The number of carbon atoms in the aromatic hydrocarbon ring structure (I) being no fewer than 25 enables forming a film being superior in terms of the etching resistance and the heat resistance.

The aromatic hydrocarbon ring structure (I) is exemplified by structure including a condensed polycyclic structure, a structure including a cyclic aggregate structure, or a structure in which these are combined. The "condensed polycyclic structure" as referred to herein means, of polycyclic structures having 2 or more aromatic hydrocarbon rings, a ring structure in which an aromatic hydrocarbon ring bonds to another aromatic hydrocarbon ring by sharing two carbon atoms. The "cyclic aggregate structure" as referred to herein means, of polycyclic structures having 2 or more aromatic hydrocarbon rings, a ring structure in which an aromatic hydrocarbon ring bonds to another hydrocarbon ring via a single bond, without bonding by sharing a carbon atom.

The condensed polycyclic ring structure is not particularly limited as long as it has no fewer than 25 carbon atoms, and examples thereof include a trinaphthylene structure (30 carbon atoms), a heptaphene structure (30 carbon atoms), a heptacene structure (30 carbon atoms), a pyranthrene structure (30 carbon atoms), an ovalene structure (32 carbon atoms), a hexabenzocoronene structure (42 carbon atoms and the like. The condensed polycyclic structure is preferably a hexabenzocoronene structure.

The condensed polycyclic structure is typically categorized, in accordance with a word ending of the name of the condensed polycyclic structure, into four types, being: a linear condensed ring structure having "-acene" as the word ending; a wing-shaped condensed ring structure having "-aphene" as the word ending; a condensed ring structure in which two identical rings are aligned, having "-alene" as the word ending; and a condensed ring structure in which benzene rings have concentrated around one ring, having "-phenylene" as the word ending. Of these categorizations, the condensed polycyclic structure is preferably the condensed ring structure in which benzene rings have concentrated around one ring, having "-phenylene" as the word ending. In the case in which the condensed polycyclic ring is the condensed ring structure in which benzene rings have concentrated around one ring, having "-phenylene" as the word ending, a proportion of carbon atoms contained is high even in the case of having the same number of carbon atoms, compared to the other condensed polycyclic structures, and consequently, the etching resistance of the film formed from the composition can be further improved. It is to be noted that the hexabenzocoronene structure described above is included in the condensed ring structure in which benzene rings have concentrated around one ring, having "-phenylene" as the word ending.

The cyclic aggregate structure is not particularly limited as long as it has no fewer than 25 carbon atoms, and examples thereof include a tetraphenylbenzene structure (30 carbon atoms), a pentaphenylbenzene structure (36 carbon atoms), a hexaphenylbenzene structure (42 carbon atoms), and the like. The cyclic aggregate structure is preferably a hexaphenylbenzene structure.

The structure in which the condensed polycyclic structure and the cyclic aggregate structure are combined is not particularly limited as long as it has no fewer than 25 carbon atoms, and examples thereof include a diphenylpyrene structure (28 carbon atoms), a dinaphthylpyrene structure (36 carbon atoms), a tetraphenylpyrene structure (40 carbon atoms), and the like.

The aromatic hydrocarbon ring structure (I) is preferably the structure including the condensed polycyclic structure. When the aromatic hydrocarbon ring structure (I) is the structure including the condensed polycyclic structure, the etching resistance and the heat resistance of the film formed from the composition can be further improved.

Partial Structure (II)

The partial structure (II) is a partial structure represented by the following formula (1).

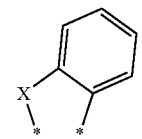

(1)

In the above formula (1), X represents a group (hereinafter, may be also referred to as "group (X)") represented by formula (i), (ii), (iii), or (iv); and *'s denote binding sites to two adjacent carbon atoms constituting the aromatic hydrocarbon ring structure (the aromatic hydrocarbon ring structure (I).

In the compound (A1), the partial structure (II) bonds to the aromatic hydrocarbon ring structure (I). More specifically, the partial structure (II) bonds to two adjacent carbon atoms constituting the aromatic hydrocarbon ring structure (I).

The lower limit of the number of the partial structure (II) in the compound (A1) is 1, and is preferably 2. The upper limit of the number of the partial structure (II) is not particularly limited, and is preferably 10, and more preferably 6. It is to be noted that in the case in which the compound (A1) has 2 or more of the partial structure (II), Xs in the above formula (1) are identical or different from each other.

Group (X)

The group (X) is a group (hereinafter, may be also referred to as "group (X-i) to (X-iv)") represented by the following formula (i), (ii), (i or (iv).

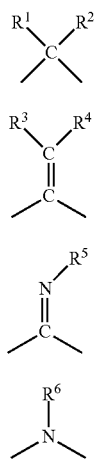

In the above formula (i), $R^1$ represents a hydrogen atom or a monovalent organic group having 1 to 20 carbon atoms; and $R^2$ represents a monovalent organic group having 1 to 20 carbon atoms.

In the above formula (ii), $R^3$ represents a hydrogen atom or a monovalent organic group having 1 to 20 carbon atoms; and $R^4$ represents a monovalent organic group having 1 to 20 carbon atoms.

In the above formula (iii), $R^5$ represents a monovalent organic group having 1 to 20 carbon atoms.

In the formula (iv), $R^6$ represents a monovalent organic group having 1 to 20 carbon atoms.

As referred to herein, "organic group" means a group having at least one carbon atom.

The monovalent organic group having 1 to 20 carbon atoms which may be represented by $R^1$, $R^2$, $R^3$, $R^4$, $R^5$, or $R^6$ is exemplified by a monovalent hydrocarbon group having 1 to 20 carbon atoms; a group (hereinafter, may be also referred to as "group (α)") that includes a divalent hetero atom-containing group between two adjacent carbon atoms of the hydrocarbon group; a group (hereinafter, may be also referred to as "group (β)") obtained by substituting with a monovalent hetero atom-containing group, a part or all of hydrogen atoms contained in the hydrocarbon group; a group (hereinafter, may be also referred to as "group (γ)") obtained by substituting with a monovalent hetero atom-containing group, a part or all of hydrogen atoms contained in the group (α); and the like.

The "hydrocarbon group" as referred to herein may be exemplified by a chain hydrocarbon group, an alicyclic hydrocarbon group, and an aromatic hydrocarbon group. The "hydrocarbon group" is exemplified by a saturated hydrocarbon group and an unsaturated hydrocarbon group. The "chain hydrocarbon group" as referred to herein means a hydrocarbon group not including a cyclic structure but being constituted with only a chain structure, and may be exemplified by a linear hydrocarbon group and a branched hydrocarbon group. The "alicyclic hydrocarbon group" as referred to herein means a hydrocarbon group that includes, as a ring structure, not an aromatic ring structure but an alicyclic structure alone, and may be exemplified by a monocyclic alicyclic hydrocarbon group and a polycyclic alicyclic hydrocarbon group. (With regard to this point, it is not necessary for the alicyclic hydrocarbon group to be constituted with only an alicyclic structure; it may include a chain structure in a part thereof.) The "aromatic hydrocarbon group" as referred to herein means a hydrocarbon group that includes an aromatic ring structure as a ring structure. (With regard to this point, it is not necessary for the aromatic hydrocarbon group to be constituted with only an aromatic ring structure; it may include an alicyclic structure or a chain structure in a part thereof.)

The monovalent hydrocarbon group having 1 to 20 carbon atoms may be exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, a combination thereof, and the like.

Examples of the monovalent chain hydrocarbon group having 1 to 20 carbon atoms include:
alkyl groups such as a methyl group, an ethyl group, an n-propyl group, an i-propyl group, an n-butyl group, a sec-butyl group, and a tert-butyl group;
alkenyl groups such as an ethenyl group, a propenyl group, and a butenyl group;
alkynyl groups such as an ethynyl group, a propynyl group, and a butynyl group; and the like.

Examples of the monovalent alicyclic hydrocarbon group having 3 to 20 carbon atoms include:
cycloalkyl groups such as a cyclopentyl group and a cyclohexyl group;
cycloalkenyl groups such as a cyclopropenyl group, a cyclopentenyl group, and a cyclohexenyl group;
bridged cyclic saturated hydrocarbon groups such as a norbornyl group, an adamantyl group, and a tricyclodecyl group;
bridged cyclic unsaturated hydrocarbon groups such as a norbornenyl group and a tricyclodecenyl group; and the like.

Examples of the monovalent aromatic hydrocarbon group having 6 to 20 carbon atoms include a phenyl group, a tolyl group, a naphthyl group, an anthracenyl group, a pyrenyl group, and the like.

The hetero atom constituting the divalent hetero atom-containing group or the monovalent hetero atom-containing group is exemplified by an oxygen atom, a nitrogen atom, a sulfur atom, a phosphorus atom, a silicon atom, a halogen atom, and the like. Examples of the halogen atom include a fluorine atom, a chlorine atom, a bromine atom, and an iodine atom.

Examples of the divalent hetero atom-containing group include —CO—, —CS—, —NH—, —O—, —S—, a combination of these, and the like.

Examples of the monovalent hetero atom-containing group include a hydroxy group, a sulfanyl group, a cyano group, a nitro group, a halogen atom, and the like.

The monovalent organic group having 1 to 20 carbon atoms which may be represented by $R^1$, $R^2$, $R^3$, $R^4$, $R^5$, or $R^6$ is preferably a group (hereinafter, may be also referred to as "group (x)") having a property of being eliminated from the compound (A1) upon heating, and a property in which solubility of the compound (A1) in the solvent (B) is enhanced. When the group (x) has the property of being eliminated from the compound (A1), a proportion of carbon atoms contained in the film formed from the composition increases, and as a result, the etching resistance can be further improved. Furthermore, when the group (x) has the property in which the solubility of the compound (A1) in the solvent (B) is enhanced, coating properties of the composition can be enhanced. It is to be noted that conditions for heating to eliminate the group (x) from the compound (A1) can be exemplified, for example, by conditions similar to conditions for heating in a heating step included in the method of forming a resist underlayer film of the yet another embodiment of the present invention, described later, and the like.

Examples of the group (x) include groups (hereinafter, may be also referred to as "groups (x-1) to (x-12)") represented by the following formulae (x-1) to (x-12), and the like.

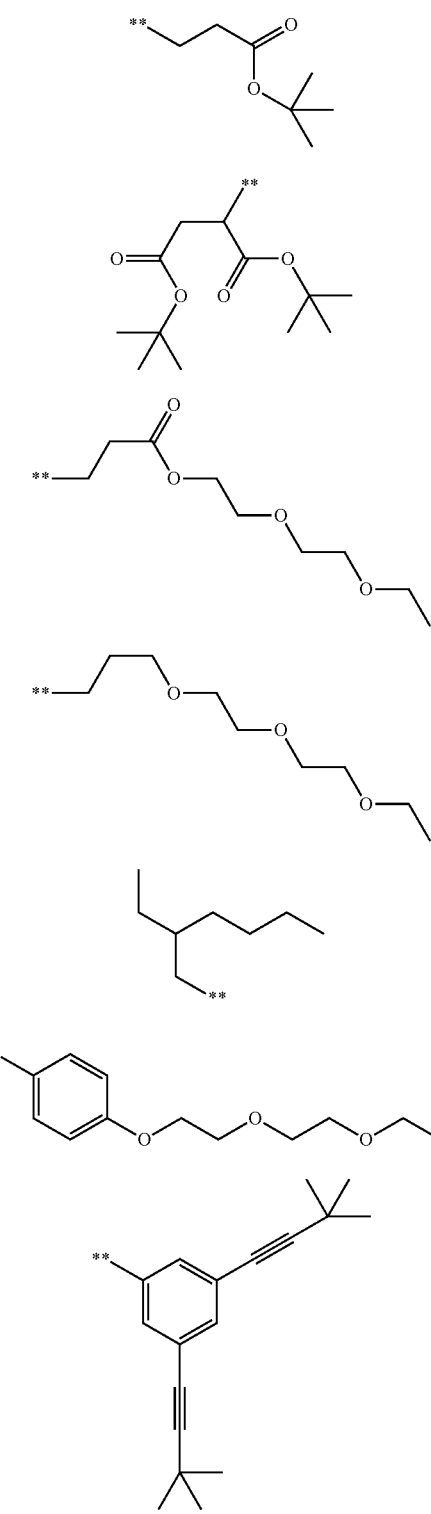

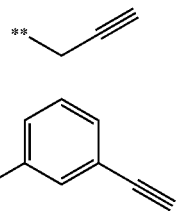

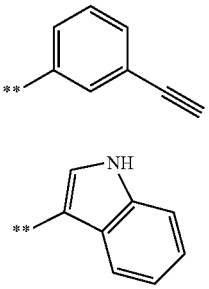

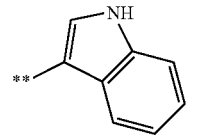

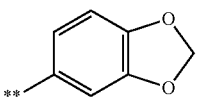

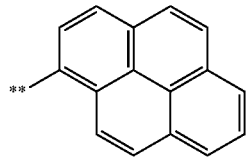

In the following formulae (x-1) to (x-12), ** denotes a site of bonding to a carbon atom or a nitrogen atom in the above formula (i), (ii), (iii), or (iv).

The group (x) is preferably the group (x-1), the group (x-3), the group (x-8), or the group (x-9).

The group (X) is preferably the group (X-i) or the group (X-ii).

Examples of the compound (A-1) include compounds (hereinafter, may be also referred to as "compounds (A1-1) to (A1-8)") represented by the following formulae (A1-1) to (A1-8).

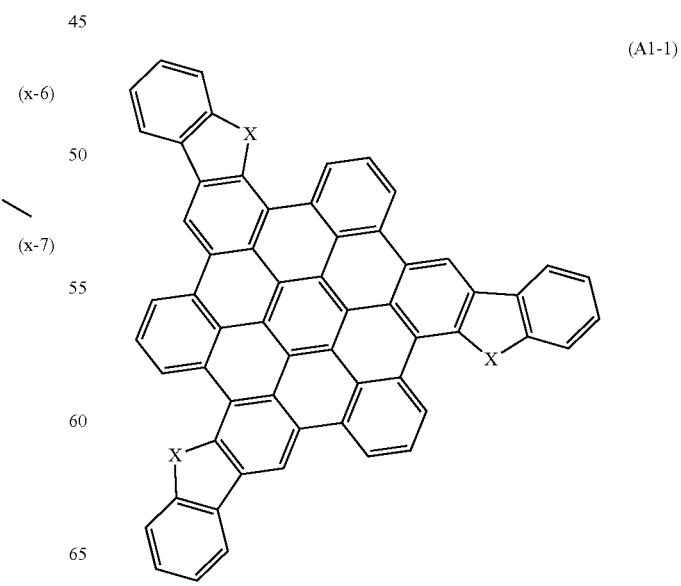

(A1-2)
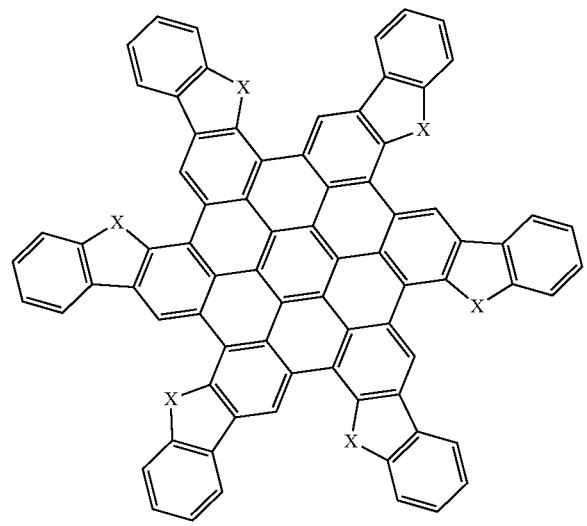
(A1-3)
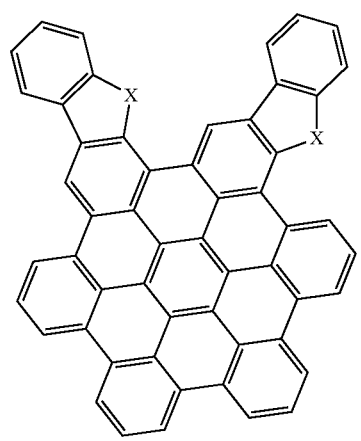
(A1-4)
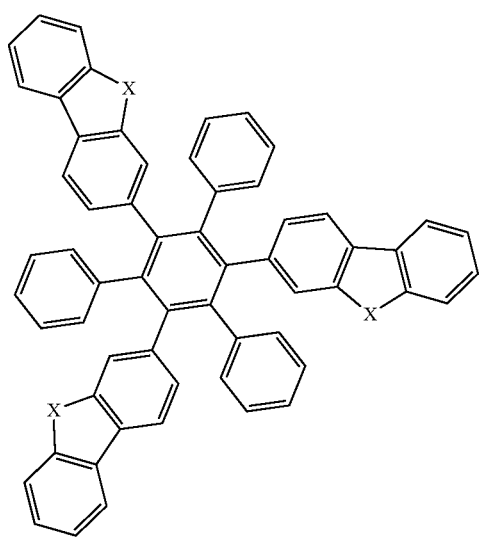
(A1-5)
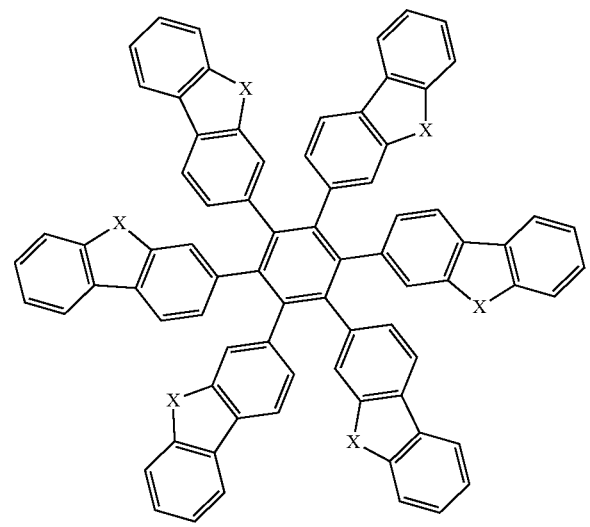
(A1-6)
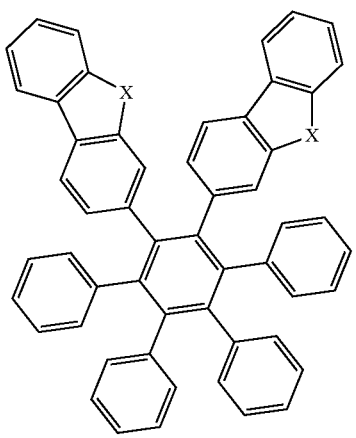
(A1-7)
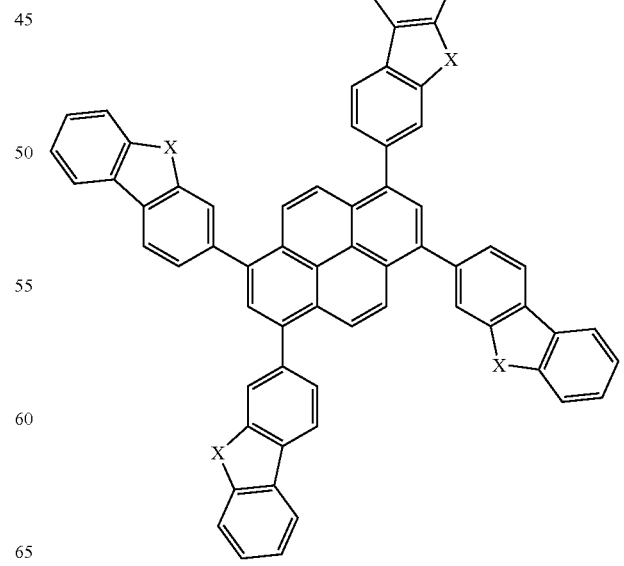

-continued

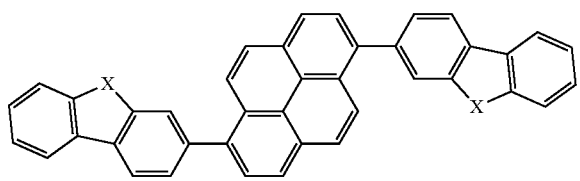

(A1-8)

In the formulae (A1-1) to (A1-8), X is as defined in the above formula (1).

The compound (A1) is preferably the compound (A1-1), the compound (A1-2), the compound (A1-3), or the compound (A1-5), and more preferably the compound (A1-1), the compound (A1-2), or the compound (A1-3).

The compound (A1) may have a substituent other than the aromatic hydrocarbon ring structure (I) and the partial group (II), described above, and the compound not having the substituent is also acceptable. The compound (A1) is preferably a compound not having the substituent. In the case in which the compound (A1) does not have the substituent, the proportion of carbon atoms contained in the compound (A1) is greater than that in the case of having the substituent, so the etching resistance of the film formed from the composition can be further improved.

The substituent is exemplified by a halogen atom, a hydroxy group, a nitro group, a monovalent organic group having 1 to 20 carbon atoms, and the like. Examples of the monovalent organic group having 1 to 20 carbon atoms as the substituent include groups similar to the groups exemplified as the monovalent organic group having 1 to 20 carbon atoms which may be represented by $R^1$ to $R^6$ in the above formulae (i) to (iv), and the like.

In the case in which the compound (A1) has the substituent, a site to which the substituent bonds is not particularly limited, and the substituent may bond to the aromatic hydrocarbon ring structure (I), or may bond to the partial structure (IT).

The lower limit of a molecular weight of the compound (A1) is preferably 600, more preferably 700, still more preferably 800, and particularly preferably 900. The upper limit of the molecular weight is preferably 5,000, more preferably 4,000, still more preferably 3,500, and particularly preferably 3,000.

The lower limit of a proportion of the compound (A1) in the composition with respect to total components other than the solvent (B) in the composition is preferably 60% by mass, more preferably 70% by mass, still more preferably 80% by mass, and particularly preferably 90% by mass. The upper limit of the proportion is, for example, 100% by mass.

Procedure of Synthesizing Compound (A1)

As a procedure of synthesizing the compound (A1), for example, the compound (A1) may be synthesized by a conventional procedure in accordance with the following synthesis scheme.

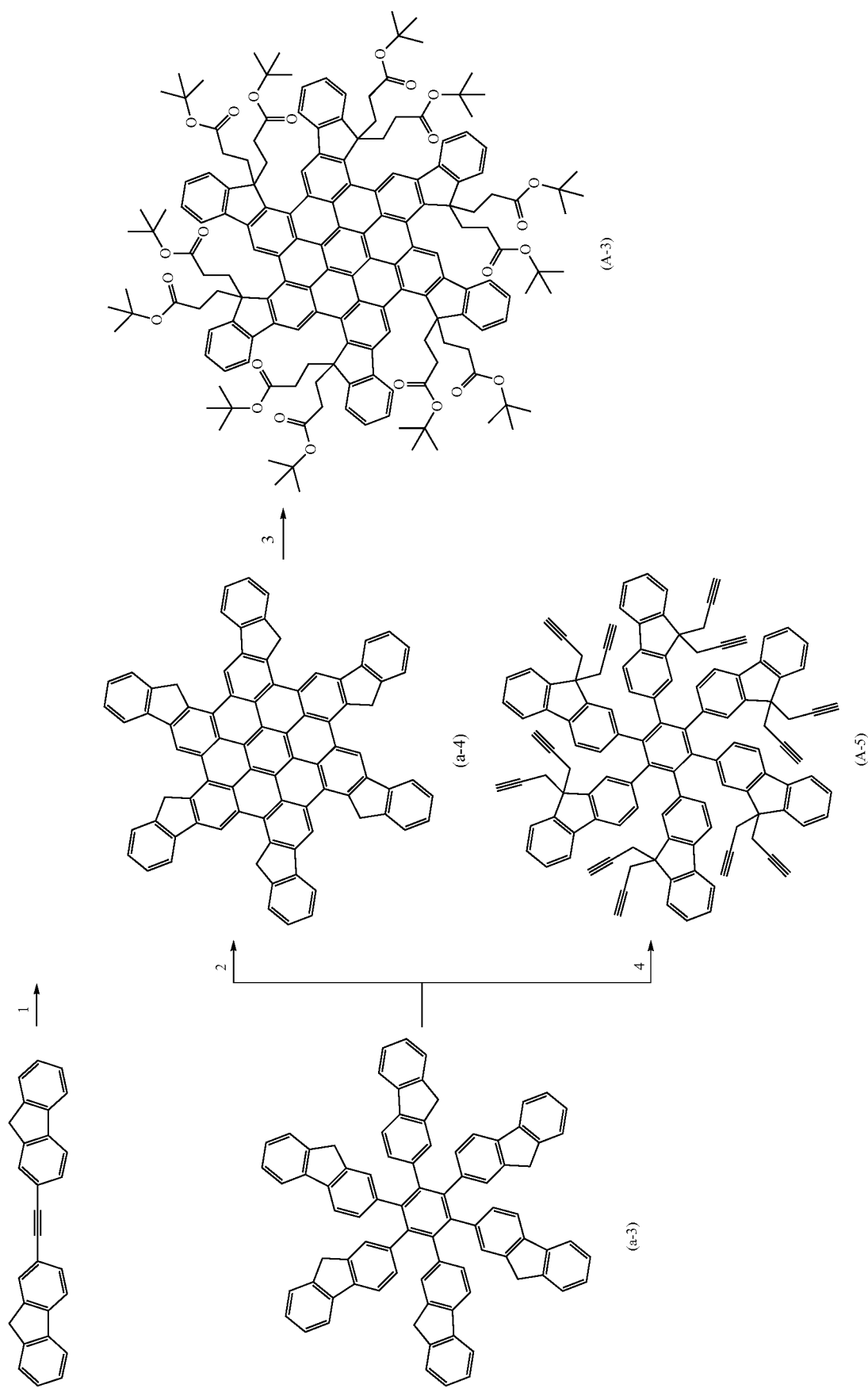

In reaction 1, a compound represented by the above formula (a-3), being an intermediate, is synthesized by reacting bis(2-fluorenyl)acetylene molecules together.

In reaction 2, a compound represented by the above formula (a-4) is synthesized by subjecting the compound represented by the above formula (a-3), synthesized in the reaction 1, to a cyclization reaction in the presence of a catalyst or the like. In reaction 3, a compound represented by the above formula (A-3) is synthesized by reacting the compound represented by the above formula (a-4), synthesized in the reaction 2, with t-butyl acrylate as a compound that gives the group (x). It is to be noted that the compound represented by the above formula (A-3) is an example of the compound (A1-2).

In reaction 4, a compound represented by the above formula (A-5) is synthesized by reacting the compound represented by the above formula (a-3), synthesized in the reaction 1, with propargyl bromide as a compound that gives the group (x). It is to be noted that the compound represented by the above formula (A-5) is an example of the compound (A1-5).

(B) Solvent

The solvent (B) is not particularly limited as long as it is a solvent capable of dissolving or dispersing the compound (A1), as well as the optional component(s), which is/are contained as needed.

The solvent (B) is exemplified by a hydrocarbon solvent, an ester solvent, an alcohol solvent, a ketone solvent, an ether solvent, a nitrogen-containing solvent, and the like. The solvent (B) may be used either alone of one type, or in a combination of two or more types thereof.

Examples of the hydrocarbon solvent include:
aliphatic hydrocarbon solvents as n-pentane, n-hexane, and cyclohexane;
aromatic hydrocarbon solvents such as benzene, toluene, and xylene; and the like.

Examples of the ester solvent include:
carbonate solvents such as diethyl carbonate;
mono ester acetate solvents such as methyl acetate and ethylacetate;
lactone solvents such as γ-butyrolactone;
polyhydric alcohol partial ether carboxylate solvents such as diethylene glycol monomethyl ether acetate and propylene glycol monomethyl ether acetate;
lactic acid ester solvents such as methyl lactate and ethyl lactate; and the like.

Examples of the alcohol solvent include:
monohydric alcohol solvents such as methanol, ethanol, and n-propanol;
polyhydric alcohol solvents such as ethylene glycol and 1,2-propylene glycol; and the like.

Examples of the ketone solvent include:
chain ketone solvents such as methyl ethyl ketone and methyl isobutyl ketone;
cyclic ketone solvents such as cyclohexanone; and the like.

Examples of the ether solvent include:
polyhydric alcohol ether solvents, e.g., chain ether solvents such as n-butyl ether, and cyclic ether solvents such as tetrahydrofuran;
polyhydric alcohol partial ether solvents such as diethylene glycol monomethyl ether; and the like.

Examples of the nitrogen-containing solvent include:
chain nitrogen-containing solvents such as N,N-dimethylacetamide;
cyclic nitrogen-containing solvents such as N-methylpyrrolidone; and the like.

The solvent (B) is preferably the ester solvent or the ketone solvent, more preferably the polyhydric alcohol partial ether carboxylate solvent or the cyclic ketone solvent, and still more preferably propylene glycol monomethyl ether acetate or cyclohexanone.

The lower limit of a proportion of the solvent (B) in the composition is preferably 50% by mass, more preferably 60% by mass, and still more preferably 70% by mass. The upper limit of the proportion is preferably 99.9% by mass, more preferably 99% by mass, and still more preferably 95% by mass.

Optional Component(s)

The composition may contain the optional component(s) within a range not leading to impairment of the effects of the present invention. The optional component(s) is/are exemplified by an acid generating agent, a crosslinking agent, a surfactant, and the like. The optional component(s) may be contained alone of one type, or in a combination of two or more types thereof. A proportion of the optional component(s) in the composition can be appropriately determined in accordance with type(s), etc. of the optional component(s).

Procedure of Preparing Composition

The composition may be prepared, for example, by mixing the compound (A1), the solvent (B), and as needed, the optional component(s) in a predetermined ratio, preferably followed by filtering a thus resulting mixture through a membrane filter, etc. having a pore size of no greater than 0.1 μm.

Resist Underlayer Film

The resist underlayer film of the other embodiment of the present invention is formed from the composition of the one embodiment of the present invention. The resist underlayer film is superior in terms of the etching resistance, the heat resistance, and the embedding property.

Method of Forming Resist Underlayer Film

The method of forming a resist underlayer film of the still another embodiment of the present invention includes a step (hereinafter, may be also referred to as "applying step") of applying a resist-underlayer-film-forming composition directly or indirectly on a substrate.

Since the method of forming a resist underlayer film uses the composition of the one embodiment of the present invention, described above, as the resist-underlayer-film-forming composition in the applying step, forming a resist underlayer film being superior in terms of the etching resistance, the heat resistance, and the embedding property is enabled.

The method of forming a resist underlayer film preferably further includes a step (hereinafter, may be also referred to as "heating step") of heating a coating film formed by the applying step.

Hereinafter, each step included in the method of forming a resist underlayer film will be described.

Applying Step

In this step, the resist-underlayer-film-forming composition is applied directly or indirectly on the substrate. In this step, the composition of the one embodiment of the present invention is used as the resist-underlayer-film-forming composition.

An applying procedure is not particularly limited, and for example, an appropriate procedure such as spin coating, cast coating, roll coating, or the like may be employed. By this step, the coating film is formed, and by occurrence of, e.g., volatilization of the solvent (B), the resist underlayer film is formed.

Examples of the substrate include metal and metalloid substrates such as a silicon substrate, an aluminum substrate, a nickel substrate, a chrome substrate, a molybdenum substrate, a tungsten substrate, a copper substrate, a tantalum substrate, and a titanium substrate, and of these, the silicon substrate is preferred. The substrate may also be provided with a silicon nitride film, an alumina film, a silicon dioxide film, a tantalum nitride film, a titanium nitride film, or the like formed thereon.

The case of applying the resist-underlayer-film-forming composition indirectly on the substrate may be exemplified by a case of applying the resist-underlayer-film-forming composition on a silicon-containing film, described later, which has been formed on the substrate.

Heating Step

In this step, the coating film formed by the applying step is heated. Formation of the resist underlayer film is promoted by the heating of the coating film. More specifically, by the heating of the coating film, elimination of the group (x) from the compound (A1), volatilization of the solvent (B), and the like are promoted.

The heating of the coating film is typically carried out in an ambient air, but may be carried out in a nitrogen atmosphere. The lower limit of a heating temperature is preferably 150° C., and more preferably 200° C. The upper limit of the heating temperature is preferably 600° C., and more preferably 500° C. The lower limit of a time period of the heating is preferably 15 seconds, and more preferably 30 seconds. The upper limit of the time period is preferably 1,200 seconds, and more preferably 600 seconds.

The lower limit of an average thickness of the resist underlayer film to be formed is preferably 30 nm, more preferably 50 nm, and still more preferably 100 nm. The upper limit of the average thickness is preferably 3,000 nm, more preferably 2,000 nm, and still more preferably 500 nm. The average thickness of the resist underlayer film is a value obtained by using a spectroscopic ellipsometer ("M2000D," available from J. A. Woollam Co.) to conduct measurements.

Method of Producing Patterned Substrate

The method of producing a patterned substrate of the yet another embodiment of the present invention includes: a step (hereinafter, may be also referred to as "applying step") of applying a resist-underlayer-film-forming composition directly or indirectly on a substrate; a step (hereinafter, may be also referred to as "resist pattern-forming step") of forming a resist pattern directly or indirectly on a resist underlayer film formed by the applying step; and a step (hereinafter, may be also referred to as "etching step") of carrying out etching using the resist pattern as a mask.

According to the method of producing a patterned substrate, due to using the composition of the one embodiment of the present invention, described above, as the resist-composition in the applying step, forming a resist underlayer film being superior in terms of the etching resistance, the heat resistance, and the embedding property is enabled; thus, the method of producing a patterned substrate enables producing a patterned substrate having a favorable pattern configuration.

The method of producing a patterned substrate may further include, as needed, a step (hereinafter, may be also referred to as "heating step") of heating a coating film formed by the applying step.

The method of producing a patterned substrate may further include, as needed, a step (hereinafter, may be also referred to as "silicon-containing film-forming step") of forming a silicon-containing film directly or indirectly on the resist underlayer film formed by the applying step or the heating step.

Hereinafter, each step included in the method of producing a patterned substrate will be described.

Applying Step

In this step, the resist-underlayer-film-forming composition is applied directly or indirectly on the substrate. This step is similar to the applying step in the method of forming a resist underlayer film of the still another embodiment of the present invention, described above.

Heating Step

In this step, the coating film formed by the applying step is heated. This step is similar to the heating step in the method of forming a resist underlayer film, described above.

Silicon-Containing Film-Forming Step

In this step, a silicon-containing film is formed directly or indirectly on the resist underlayer film formed by the applying step or the heating step. The case of forming the silicon-containing film indirectly on the resist underlayer film may be exemplified by a case in which a resist-underlayer-film-surface modification film has been formed on the resist underlayer film. The resist-underlayer-film-surface modification film is a film having, for example, an angle of contact with water being different from that of the resist underlayer film.

The silicon-containing film may be formed by applying a silicon-containing-film-forming composition, a chemical vapor deposition (CVD) procedure, atomic layer deposition (ALD), or the like. A procedure of forming the silicon-coating film by applying the silicon-containing-film-forming composition is exemplified by: applying the silicon-containing-film-forming composition directly or indirectly on the resist underlayer film to form a coating film; and hardening the coating film by subjecting the coating film to an exposure and/or heating. As a commercially available product of the silicon-containing-film-forming composition, for example, "NFC SOG01," "NFC SOG04," or "NFC SOG080" (all available from JSR Corporation), or the like may be used. For example, a silicon oxide film, a silicon nitride film, a silicon oxynitride film, an amorphous silicon film, or the like can be formed by the chemical vapor deposition (CVD) procedure or the atom layer deposition (ALD).

Examples of the radioactive ray which may be used for the exposure include: electromagnetic waves such as a visible light ray, an ultraviolet ray, a far ultraviolet ray, an X-ray, and a γ-ray; particle rays such as an electron beam, a molecular beam, and an ion beam; and the like.

The lower limit of a temperature when heating the coating film is preferably 90° C., more preferably 150° C., and still more preferably 200° C. The upper limit of the temperature is preferably 550° C., more preferably 450° C., and still more preferably 300° C.

The lower limit of an average thickness of the silicon-containing film to be formed is preferably 1 nm, more preferably 10 nm, and still more preferably 20 nm. The upper limit of the average thickness is preferably 20,000 nm, more preferably 1,000 nm, and still more preferably 100 nm. It is to be noted that similar to the average thickness of the resist underlayer film, the average thickness of the silicon-containing film is a value measured using the spectroscopic ellipsometer.

Resist Pattern-Forming Step

In this step, the resist pattern is formed directly or indirectly on the resist underlayer film. A procedure of carrying out this step may be exemplified by a procedure of using a resist composition, a procedure of using a nanoimprinting procedure, a procedure of using a directed self-assembling composition, and the like. The case of forming the resist pattern indirectly on the resist underlayer film may be exemplified by a case in which the resist pattern is formed on the silicon-containing film, and the like.

With regard to the procedure of using the resist composition, specifically, the resist film is formed by: applying the resist composition such that a resist film to be formed has a predetermined thickness, and thereafter subjecting the resist composition to prebaking to volatilize the solvent in the coating film.

Examples of the resist composition include a chemically amplified positive or negative resist composition that contains a radiation-sensitive acid generating agent; a positive resist composition that contains an alkali-soluble resin and a quinone diazide-based photosensitizing agent; a negative resist composition that contains an alkali-soluble resin and a crosslinking agent; and the like.

The lower limit of a proportion of total components other than the solvent in the resist composition is preferably 0.3% by mass, and more preferably 1% by mass. The upper limit of the proportion is preferably 50% by mass, and more preferably 30% by mass. Moreover, the resist composition is typically used for forming a resist film, for example, after being filtered through a filter with a pore size of no greater than 0.2 μm. It is to be noted that a commercially available resist composition may be used as is in this step.

A procedure for applying the resist composition may be exemplified by, e.g., spin coating and the like. A temperature and time period of prebaking may be appropriately adjusted in accordance with the type of the resist composition employed and the like. The lower limit of the temperature is preferably 30° C., and more preferably 50° C. The upper limit of the temperature is preferably 200° C., and more preferably 150° C. The lower limit of the time period is preferably 10 seconds, and more preferably 30 seconds. The upper limit of the time period is preferably 600 seconds, and more preferably 300 seconds.

Next, the resist film formed is exposed by selective irradiation with a radioactive ray. The radioactive ray used in the exposure may be appropriately selected in accordance with, e.g., the type of the radiation-sensitive acid generating agent used in the resist composition, and examples of the radioactive ay include: electromagnetic waves such as visible rays, ultraviolet rays, far ultraviolet rays, X-rays, and γ radiations; and particle rays such as electron beams, molecular beams, and ion beams. Among these, far ultraviolet rays are preferred, a KrF excimer laser beam (wavelength: 248 nm), an ArF excimer laser beam (wavelength: 193 nm), an $F_2$ excimer laser beam (wavelength: 157 nm), a $Kr_2$ excimer laser beam (wavelength: 147 nm), an ArKr excimer laser beam (wavelength: 134 nm), or an extreme ultraviolet ray (wavelength: 13.5 nm, etc.; hereinafter, may be also referred to as "EUV") is more preferred, and a KrF excimer laser beam, an ArF excimer laser beam, or EUV is still more preferred.

Post-baking may be carried out after the exposure for the purpose of improving a resolution, a pattern profile, developability, and the like. A temperature and time period of the post-baking may be appropriately determined in accordance with the type of the resist composition employed and the like. The lower limit of the temperature is preferably 50° C., and more preferably 70° C. The upper limit of the temperature is preferably 200° C., and more preferably 150° C. The lower limit of a time period of the post-baking is preferably 10 seconds, and more preferably 30 seconds. The upper limit of the time period is preferably 600 seconds, and more preferably 300 seconds.

Next, the resist film exposed is developed with a developer solution to forma resist pattern. The development may be carried out by either development with an alkali, or development with an organic solvent. In the case of the development with an alkali, examples of the developer solution include a basic aqueous solution that contains sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetra ethylammonium hydroxide (TMAH), tetraethylammonium hydroxide, pyrrole, piperidine, choline, 1,8-diazabicyclo[5.4.0]-7-undecene, 1,5-diazabicyclo[4.3.0]-5-nonene, or the like. To the basic aqueous solution, a water-soluble organic solvent, for example, alcohols such as methanol and ethanol, a surfactant, etc., may be added, each in an appropriate amount. Alternatively, in the case of the development with an organic solvent, examples of the developer solution include various organic solvents exemplified as the solvent (B) of the composition of the one embodiment of the present invention, described above, and the like.

A predetermined resist pattern is formed by development with the developer solution, followed by washing and drying.

Etching Step

In this step, etching is carried out by using the resist pattern as a mask. The etching may be conducted once or multiple times. In other words, the etching may be conducted sequentially with patterns obtained by the etching as masks. In light of obtaining a pattern having a more favorable configuration, the etching is preferably conducted multiple times. In the case in which the etching is conducted multiple times, for example, the silicon-containing film, the resist underlayer film, and the substrate are subjected to the etching sequentially in this order. An etching procedure may be exemplified by dry etching, wet etching, and the like. In light of making the configuration of the substrate pattern more favorable, the dry etching is preferred. In the dry etching, for example, gas plasma such as oxygen plasma, or the like may be used. By the etching, the patterned substrate having a predetermined pattern can be obtained.

The dry etching may be conducted by using, for example, a well-known dry etching apparatus. An etching gas to be used for the dry etching may be appropriately selected in accordance with the mask pattern, element composition of the film to be etched, and the like. Examples of the etching gas include: fluorine-based gases such as $CHF_3$, $CF_4$, $C_2F_6$, $C_3F_8$, and $SF_6$; chlorine-based gases such as $Cl_2$ and $BCl_3$; oxygen-based gases such as $O_2$, $O_3$, and $H_2O$; reductive gases such as $H_2$, $NH_3$, CO, $CO_2$, $CH_4$, $C_2H_2$, $C_2H_4$, $C_2H_6$, $C_3H_4$, $C_3H_6$, $C_3H_8$, HF, HI, HBr, HCl, NO, $NH_3$, and $BCl_3$; inert gases such as He, $N_2$, and Ar; and the like. These gases may be used as a mixture. In the case of etching the substrate using the resist underlayer film pattern as a mask, the fluorine-based gas is typically used.

(A2) Compound

The compound (A2) is a compound which has an aromatic hydrocarbon ring structure (hereinafter, may be also referred to as "aromatic hydrocarbon ring structure (I')") and a partial structure (hereinafter, may be also referred to as "partial structure (II')") represented by the following formula (2), wherein the aromatic hydrocarbon ring structure has no fewer than 25 carbon atoms.

The compound (A2) can be suitably used as a component of the composition of the one embodiment of the present invention, described above. Furthermore, the compound (A2) can also be used as an intermediate in synthesizing the compound (A1), described above.

Aromatic Hydrocarbon Ring Structure (I')

The aromatic hydrocarbon ring structure (I') is an aromatic hydrocarbon ring structure having no fewer than 25 carbon atoms. The aromatic hydrocarbon ring structure (I') is similar to the aromatic hydrocarbon ring structure (I) in the compound (A1), described above.

Partial Structure (II')

The partial structure (II') is a partial structure represented by the following formula (2).

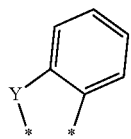

(2)

In the above formula (2), Y represents a group (hereinafter, may be also referred to as "group (Y)") represented by the following formula (v), (vi), (vii), or (viii); and *'s denote binding sites to two adjacent carbon atoms constituting the aromatic hydrocarbon ring structure (aromatic hydrocarbon ring structure (I')).

In the compound (A2), the partial structure (II') is bonded to the aromatic hydrocarbon ring structure (I'). More specifically, the partial structure (II') is bonded to two adjacent carbon atoms constituting the aromatic hydrocarbon ring structure (I').

The lower limit of the number of the partial structure (II') in the compound (A2) is 1, and is preferably 2. The upper limit of the number of the partial structure (II') is not particularly limited, and is preferably 10, and more preferably 6. It is to be noted that in the case in which the compound (A2) has 2 or more of the partial structure (II'), Ys in the above formula (2) are identical or different from each other.

Group (Y)

The group (Y) is a group (hereinafter, may be also referred to as "group (Y-v) to (Y-viii)") represented by the following formula (v), (vi), (vii), or

(v)

(vi)

(vii)

(viii)

In the above formula (v), $R^7$ and $R^8$ each independently represent a hydrogen atom or a monovalent organic group having 1 to 20 carbon atoms.

In the above formula (vi), $R^9$ and $R^{10}$ each independently represent a hydrogen atom or a monovalent organic group having 1 to 20 carbon atoms.

In the above formula (vii), $R^{11}$ represents a hydrogen atom or a monovalent organic group having 1 to 20 carbon atoms.

In the above formula (viii), $R^{12}$ represents a hydrogen atom or a monovalent organic group having 1 to 20 carbon atoms.

The monovalent organic group having 1 to 20 carbon atoms which may be represented by $R^7$, $R^8$, $R^9$, $R^{10}$, $R^{11}$, or $R^{12}$ may be exemplified by groups similar to the groups exemplified as the monovalent organic group having 1 to 20 carbon atoms which may be represented by $R^1$ to $R^6$ in the above formulae (i) to (iv), and the like.

As the group (Y), a case in which all of $R^7$ to $R^{12}$ in the above formulae (v) to (viii) represent a hydrogen atom (hereinafter, may be also referred to as (group (Y-1)), or a case in which at least one of $R^7$ to $R^{12}$ in the above formulae (v) to (viii) represents the monovalent organic group having 1 to 20 carbon atoms (hereinafter, may be also referred to as "group (Y-2)") is preferred.

In the case in which the compound (A2) has the group (Y-1), the compound (A2) is useful as the intermediate of the compound (A1) described above.

In the case in which the compound (A2) has the group (Y-2), similar to the compound (A1), described above, the compound (A2) can be suitably used as a component of the composition of the one embodiment of the present invention, described above.

The group (Y) is preferably the group (Y-v).

Examples of the compound (A2) include compounds (hereinafter, may be also referred to as "compounds (A2-1) to (A2-8)") represented by the following formulae (A2-1) to (A2-8).

(A2-1)
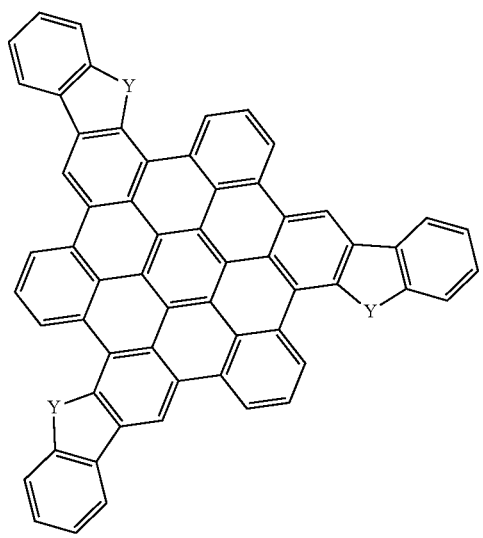
(A2-2)
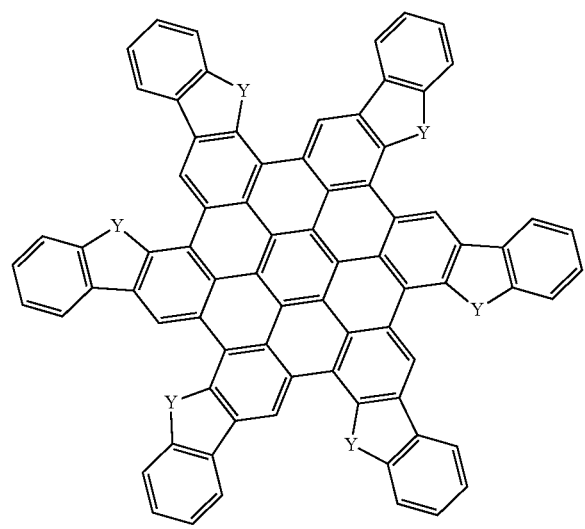
(A2-3)
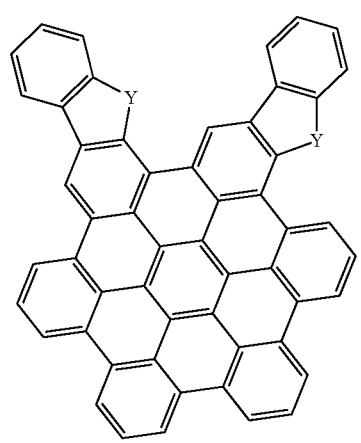
(A2-4)
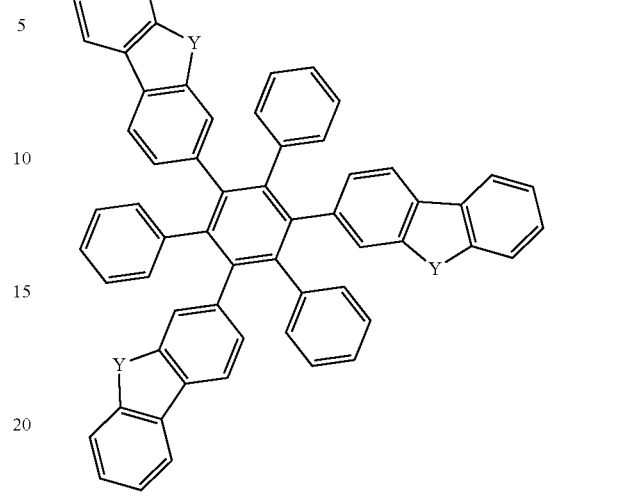
(A2-5)
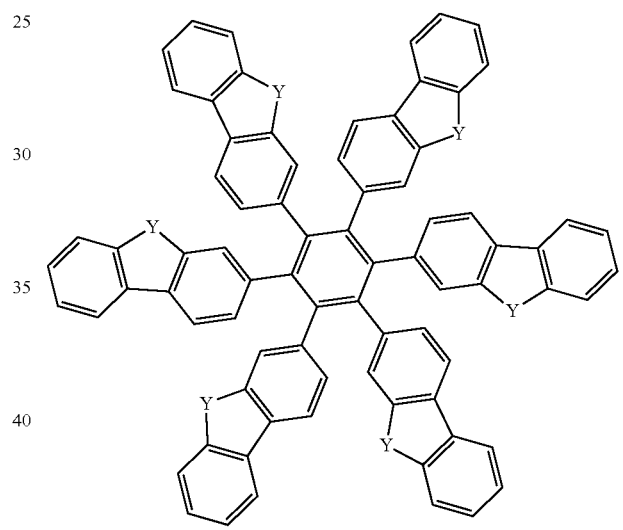
(A2-6)
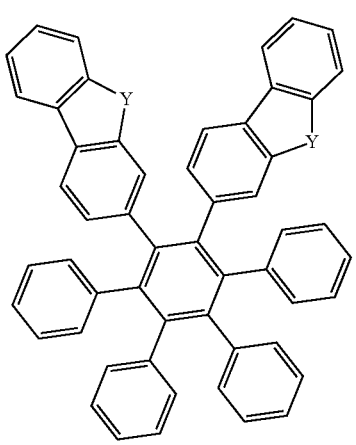

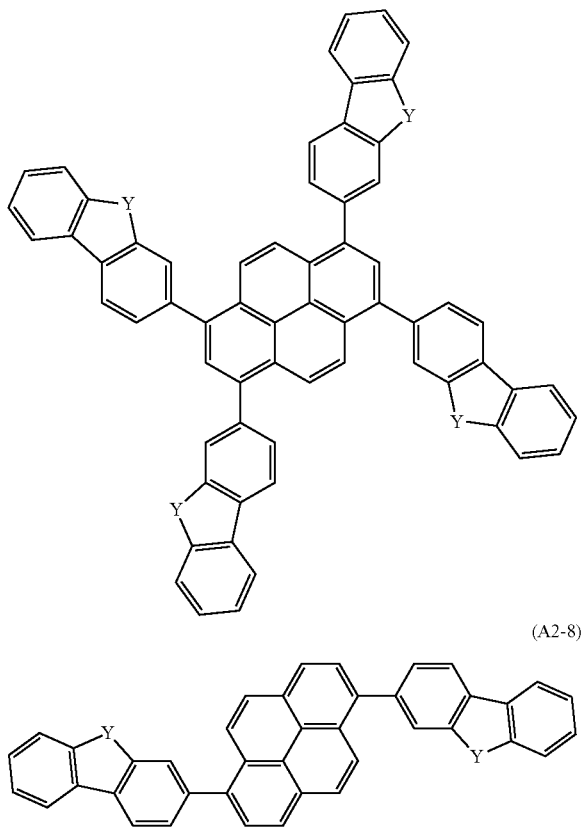

(A2-7)

(A2-8)

In the above formulae (A2-1) to (A2-8), Y is as defined in the above formula (2).

The compound (A2) is preferably the compound (A2-1), the compound (A2-2), the compound (A2-3), or the compound (A2-5), and is more preferably the compound (A2-1), the compound (A2-2), or the compound (A2-3).

The compound (A2) may have a substituent other than the aromatic hydrocarbon ring structure (I') and the partial group (II'), described above, and the compound not having the substituent is also acceptable. The compound (A2) is preferably a compound not having the substituent.

Examples of the substituent include groups similar to the groups exemplified as the substituent in the case of being contained in the compound (A1), described above, and the like.

In the case in which the compound (A2) has the substituent, a site to which the substituent bonds is not particularly limited, and the substituent may bond to the aromatic hydrocarbon ring structure (I'), or may bond to the partial structure (II').

The lower limit of a molecular weight of the compound (A2) is preferably 600, more preferably 700, still more preferably 800, and particularly preferably 900. The upper limit of the molecular weight is preferably 5,000, more preferably 4,000, still more preferably 3,500, and particularly preferably 3,000.

Procedure of Synthesizing Compound (A2)

As a procedure of synthesizing the compound (A2), for example, the compound (A2) may be synthesized by a procedure similar to the procedure of synthesizing the compound (A1), described above. It is to be noted that the compound represented by formula (a-3) in the above synthesis scheme is an example of the above compound (A2-5), and the compound represented by the formula (a-4) is an example of the compound (A2-2).

EXAMPLES

Hereinafter, the present invention is explained in further detail by way of Examples, but the present invention is not in any way limited to these Examples.

Synthesis of Compound (A1)

Compounds (hereinafter, may be also referred to as "compounds (a-1) to (a-8), (A-1) to (A-12), (ca-1), and (CA-1)") represented by the following formulae (a-1) to (a-8), (A-1) to (A-12), (ca-1), and (CA-1) were synthesized by procedures presented below.

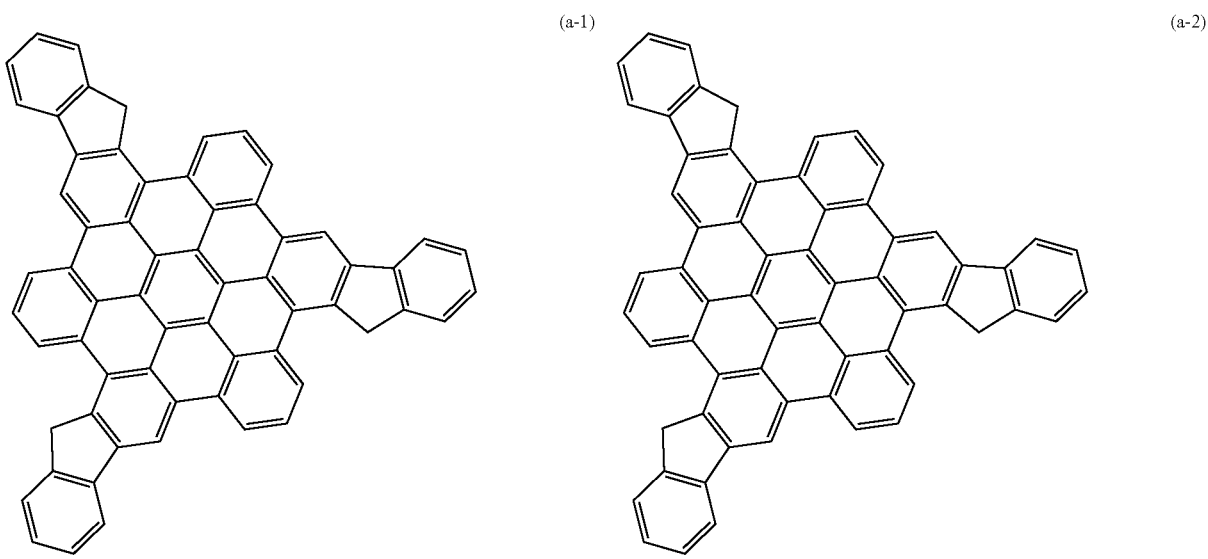

-continued
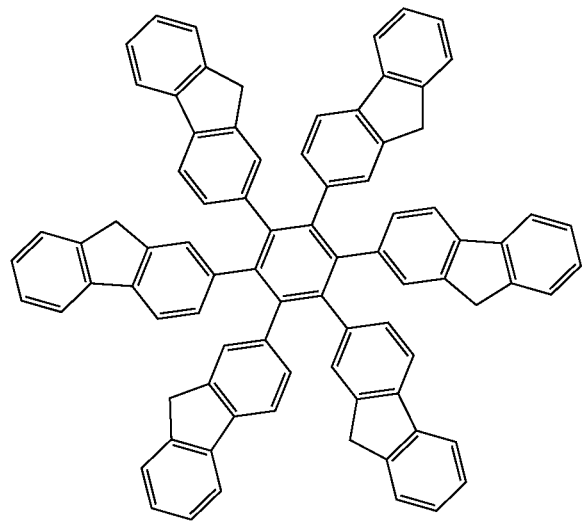
(a-3)
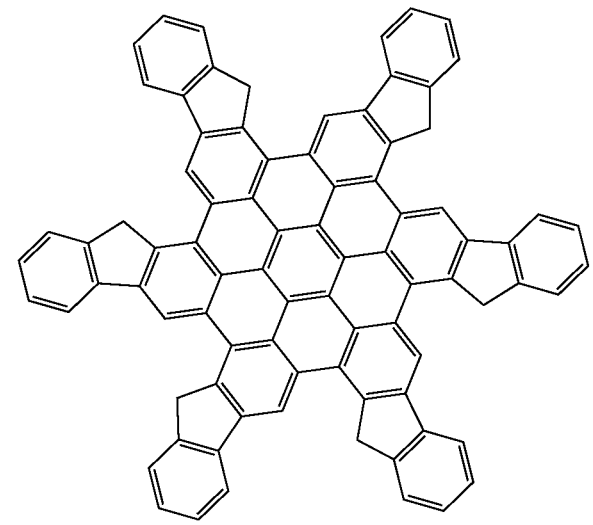
(a-4)
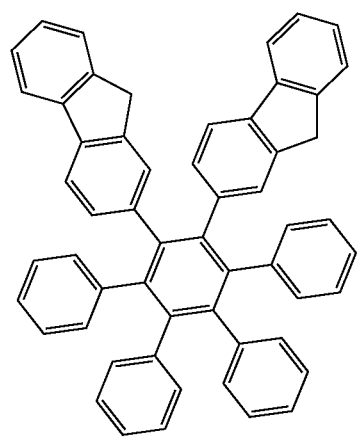
(a-5)
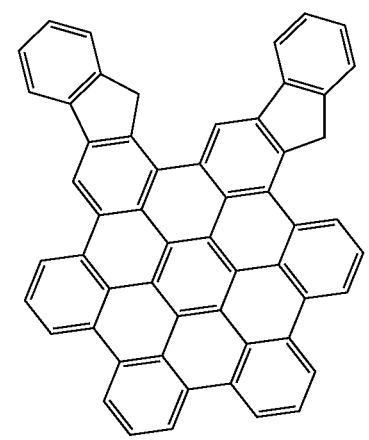
(a-6)
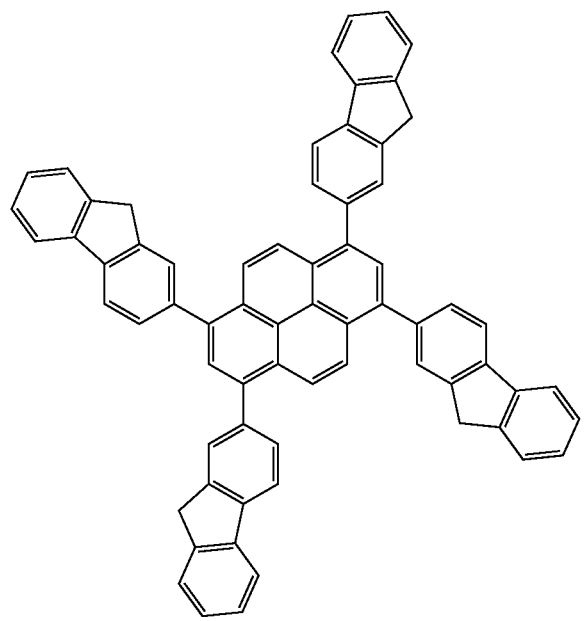
(a-7)
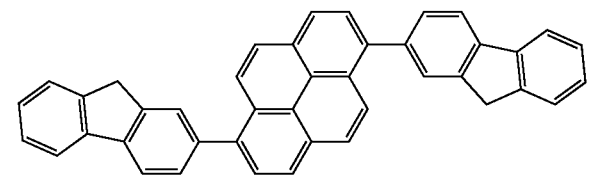
(a-8)

(A-1)
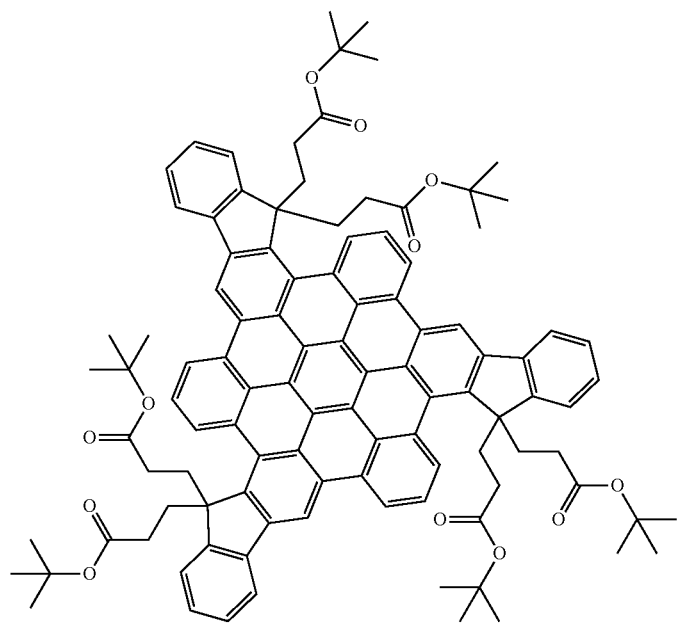
(A-2)
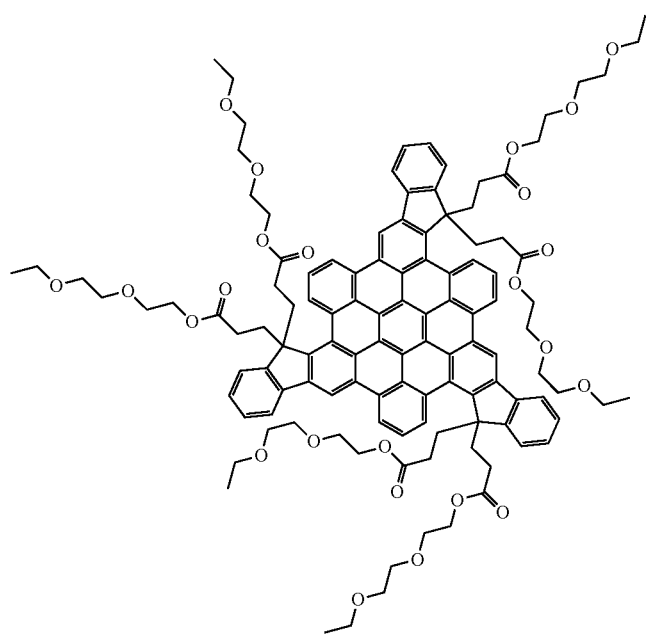

-continued
(A-3)
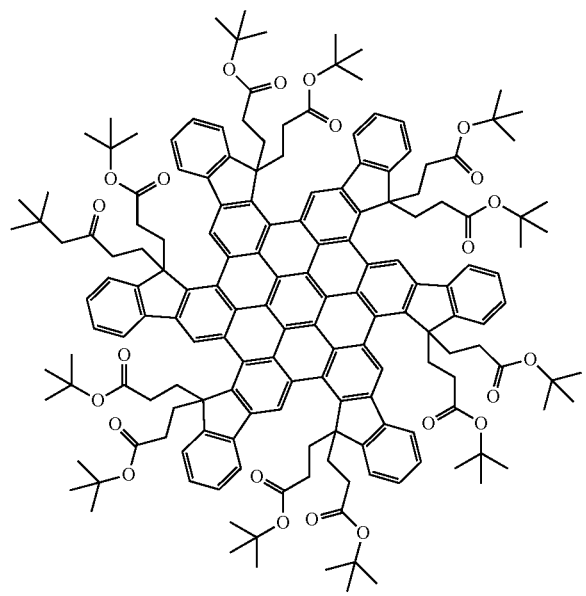
(A-4)
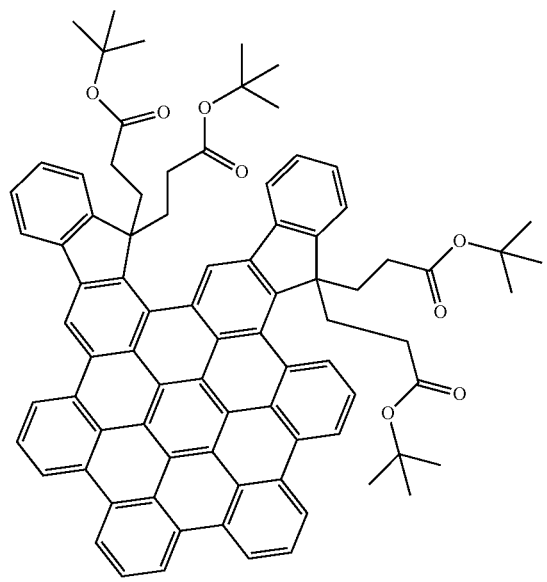
(A-5)
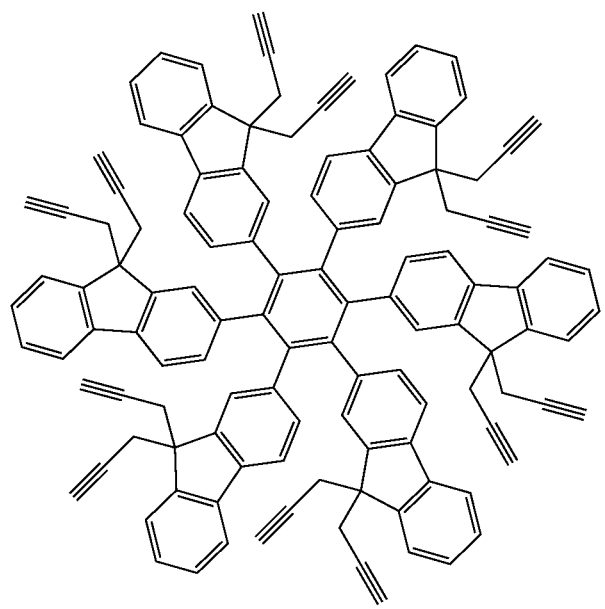
(A-6)
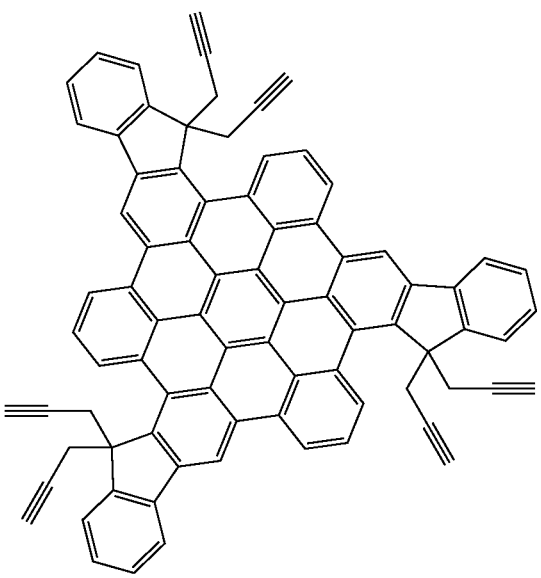

-continued
(A-7)
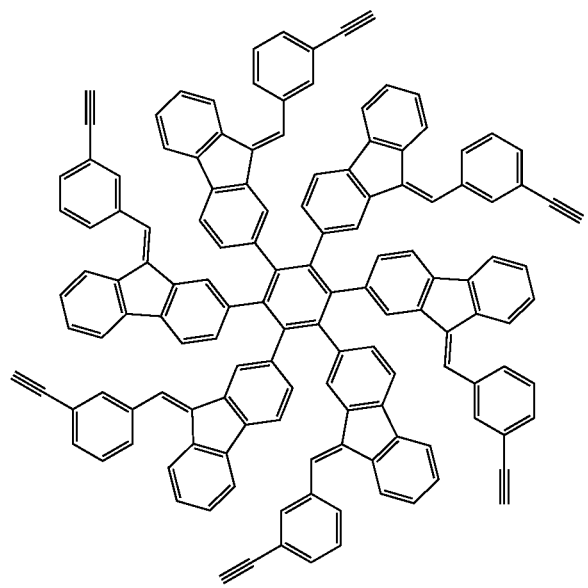
(A-8)
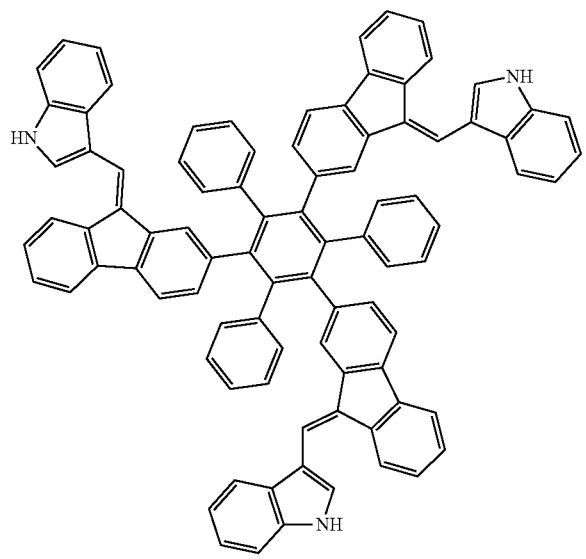
(A-9)
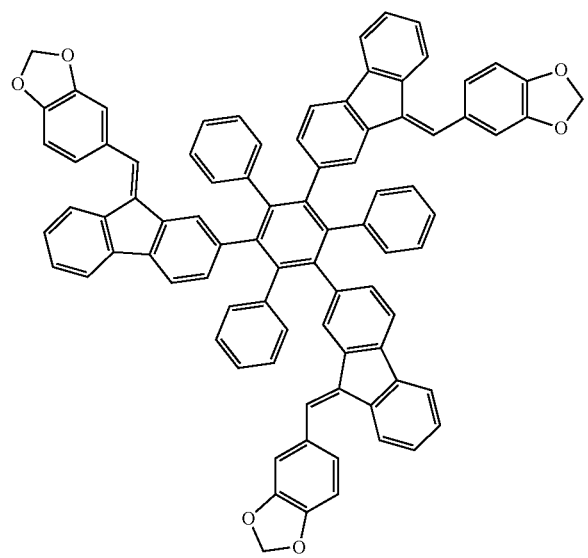
(A-10)
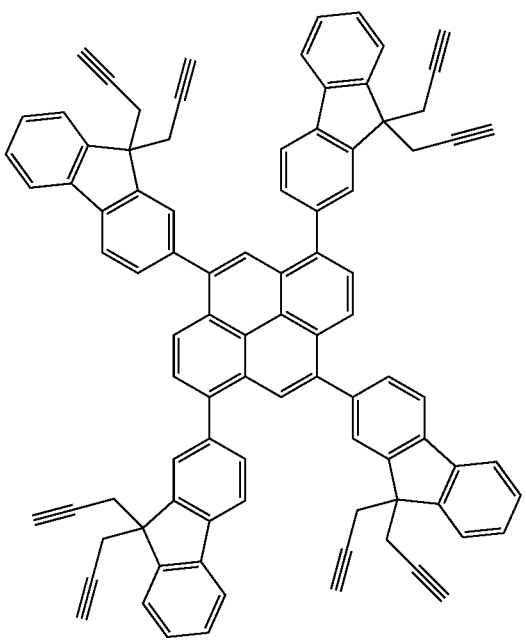

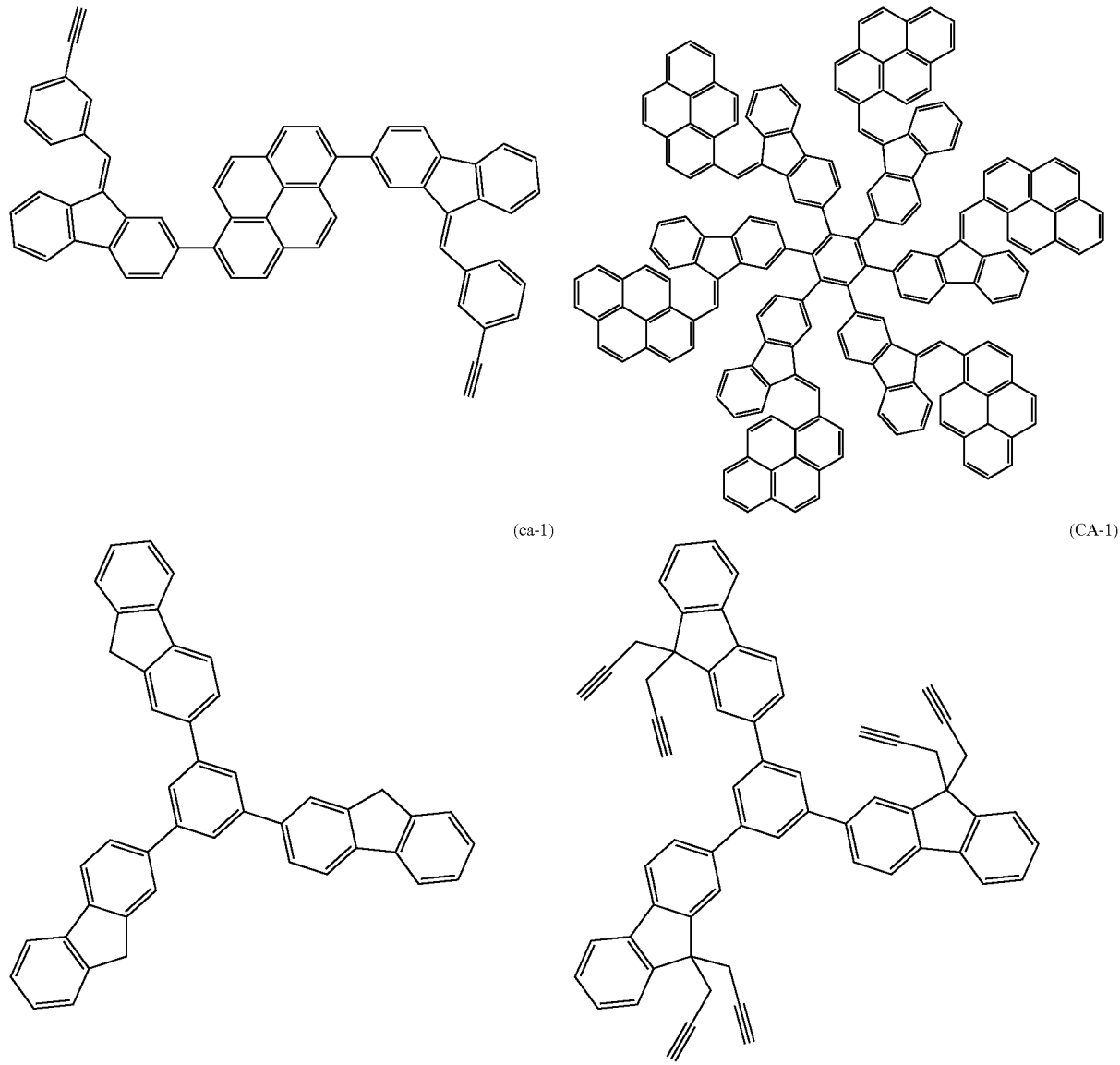

Synthesis Example 1: Synthesis of Compound (a-1)

Into a reaction vessel were charged 20.0 g of 2-phenylethynylfluorene and 200 g of 1,4-dioxane in a nitrogen atmosphere, followed by dissolving at 50° C. Next, 1.28 g of octacarbonyl dicobalt was added thereto, a resulting solution was heated to 110° C., and a reaction was permitted for 12 hours. After termination of the reaction, a resulting reaction liquid was cooled to room temperature, and adding 600 g of methanol and 60.0 g of water gave a precipitate. The precipitate thus obtained was collected on a filter paper, and then washing with a large amount of methanol and drying gave the compound (a-1). The molecular weight of the compound (a-1) was 799.

Synthesis Example 2: Synthesis of Compound (a-2)

Into a reaction vessel were charged 15.0 g of the compound (a-1) and 760 g of dichloromethane in a nitrogen atmosphere, and a resulting solution was dissolved at room temperature, and then cooled to 0° C. Next, a solution in which 60.9 g of anhydrous iron chloride (III) was dissolved in 380 g of nitromethane was added dropwise thereto. After permitting a reaction at 0° C. for 2 hours, a resulting reaction liquid was heated to 20° C., and a further reaction was permitted for 2 hours. After termination of the reaction, adding 1,140 g of methanol gave a precipitate. The thus obtained precipitate was collected on a filter paper, and then washing with a large amount of methanol and tetrahydrofuran (hereinafter, may be also referred to as "THF"), and drying gave the compound (a-2). The molecular weight of the compound (a-2) was 787.

Synthesis Example 3: Synthesis of Compound (a-3)

Into a reaction vessel were charged 20.0 g of bis(2-fluorenyl)acetylene and 600 g of 1,4-dioxane in a nitrogen atmosphere, followed by stirring at 50° C. Next, 3.85 g of octacarbonyl dicobalt was added thereto, a resulting mixture was heated to 110° C., and a reaction was permitted for 12 hours. After termination of the reaction, a resulting reaction liquid was cooled to room temperature, and adding 600 g of methanol and 60.0 g of water gave a precipitate. The precipitate thus obtained was collected on a filter paper, and then washing with a large amount of solution in which a proportion of THF/hexane was 50/50% by mass and drying gave the compound (a-3). The molecular weight of the compound (a-3) was 1,063.

Synthesis Example 4: Synthesis of Compound (a-4)

The compound (a-4) was obtained by an operation similar to that of Synthesis Example 2, except that 20.0 g of the compound (a-3) was used instead of 15.0 g of the compound (a-1). The molecular weight of the compound (a-4) was 1,051.

Synthesis Example 5: Synthesis of Compound (a-5)

Into a reaction vessel were charged 20.0 g of bis(2-fluorenyl)acetylene, 21.7 g of tetraphenylcyclopentadienone, and 125 g of sulfolane in a nitrogen atmosphere, followed by stirring at 50° C. and then heating to 210° C., and a reaction was permitted for 8 hours. After termination of the reaction, a resulting reaction liquid was cooled to room temperature, and adding 125 g of methanol and 50.0 g of water gave a precipitate. Recrystallizing the precipitate thus obtained using toluene and then drying gave the compound (a-5). The molecular weight of the compound (a-5) was 711.

Synthesis Example 6: Synthesis of Compound (a-6)

The compound (a-6) was obtained by an operation similar to that of Synthesis Example 2, except that 13.9 g of the compound (a-5) was used instead of 15.0 g of the compound (a-1). The molecular weight of the compound (a-6) was 699.

Synthesis Example 7: Synthesis of Compound (A-1)

Into a reaction vessel were charged 10.0 g of the compound (a-2), 14.7 g of t-butyl acrylate, and 162 g of THE in a nitrogen atmosphere, followed by stirring, and then 15.4 g of a 50% by mass aqueous potassium hydroxide solution and 2.46 g of tetrabutylammonium bromide were added to a resulting mixture, and a reaction was permitted at 60° C. for 4 hours. After termination of the reaction, a resulting reaction liquid was cooled to room temperature, and 162 g of methyl isobutyl ketone was added. An aqueous layer was removed, followed by using a 1% by mass aqueous oxalic acid solution and water to conduct extraction by liquid separation, and then charging an organic layer into hexane to permit reprecipitation. The precipitate was collected on a paper filter and then dried to give the compound (A-1). The molecular weight of the compound (A-1) was 1,556.

Synthesis Example 8: Synthesis of Compound (A-2)

The compound (A-2) was obtained by a similar operation to that of Synthesis Example 7, except that 21.5 g of 2-(2-ethoxyethoxy)ethyl acrylate was used instead of 22.3 of t-butyl acrylate. The molecular weight of the compound (A-2) was 1,916.

Synthesis Example 9: Synthesis of Compound (A-3)

The compound (A-3) was obtained by a similar operation to that of Synthesis Example 7, except that 6.5 g of the compound (a-4) was used instead of 10.0 g of the compound (a-2). The molecular weight of the compound (A-3) was 2,589.

Synthesis Example 10: Synthesis of Compound (A-4)

The compound (A-4) was obtained by a similar operation to that of Synthesis Example 7, except that 14.0 g of the compound (a-6) was used instead of 10.0 g of the compound (a-2). The molecular weight of the compound (A-4) was 1,212.

Synthesis Example 11: Synthesis of Compound (A-5)

Into a reaction vessel were charged 10.0 g of the compound (a-3), 200 g of THF, and 19.0 g of potassium t-butoxide in a nitrogen atmosphere, followed by stirring at 60° C. for 30 minutes. Next, a thus obtained mixture was cooled to 40° C., 20.1 g of propargyl bromide was added dropwise, and a reaction was permitted at 0° C. for 2 hours. After termination of the reaction, 500 g of a 5% by mass aqueous oxalic acid solution and 100 g of methyl isobutyl ketone were added. An aqueous layer was removed, followed by using water to conduct extraction by liquid separation, and then charging an organic layer into hexane to permit reprecipitation. The precipitate was collected on a paper filter and then dried to give the compound (A-5). The molecular weight of the compound (A-5) was 1,520.

Synthesis Example 12: Synthesis of Compound (A-6)

The compound (A-6) was obtained by an operation similar to that of Synthesis Example 11, except that 14.0 g of the compound (a-2) was used instead of 10.0 g of the compound (a-3). The molecular weight of the compound (A-6) was 1,015.

Synthesis Example 13: Synthesis of Compound (A-7)

Into a reaction vessel were charged 10.0 g of the compound (a-3), 8.81 g of 3-ethynylbenzaldehyde, and 94.1 g of N-methyl pyrrolidone in a nitrogen atmosphere, followed by stirring, and then 17.2 g of diazabicycloundecene was added thereto, and a reaction was permitted at 120° C. for 24 hours. After termination of the reaction, 500 g of a 5% by mass aqueous oxalic acid solution and 100 g of methyl isobutyl ketone were added. An aqueous layer was removed, followed by using water to conduct extraction by liquid separation, and then charging an organic layer into hexane to permit reprecipitation. The precipitate was collected on a paper filter and then dried to give the compound (A-7). The molecular weight of the compound (A-7) was 1,736.

Synthesis Example 13: Synthesis of Compound (A-8)

Into a reaction vessel were charged 10.0 g of the compound (a-1), 6.54 g of indole-3-carboxyaldehyde, and 82.7 g of m-xylene in a nitrogen atmosphere, followed by stirring, and then 17.2 g of diazabicycloundecene was added thereto, and a reaction was permitted at 140° C. for 24 hours. After termination of the reaction, 500 g of a 5% by mass aqueous oxalic acid solution and 100 g of methyl isobutyl ketone were added. An aqueous layer was removed, followed by using water to conduct extraction by liquid separation, and then charging an organic layer into hexane to permit reprecipitation. The precipitate was collected on a paper filter and then dried to give the compound (A-8). The molecular weight of the compound (A-8) was 1,180.

Synthesis Example 14: Synthesis of Compound (A-9)

The compound (A-9) was obtained by a similar operation to that of Synthesis Example 13, except that 6.76 of piperonal was used instead of 6.54 g of indole-3-carboxyaldehyde. The molecular weight of the compound (A-9) was 1,195.

Synthesis Example 15: Synthesis of Compound (a-7)

Into a reaction vessel were charged 10.0 g of 1,3,6,8-tetrabromopyrene, 33.86 g of 9H-fluorene-2-boronic acid pinacol, and 300 g of tetrahydrofuran in a nitrogen atmosphere, followed by stirring, and then 169 g of a 20% by mass aqueous potassium carbonate solution and 1.28 g of a [1,1'-bis(diphenylphosphino)ferrocene]palladium (II) dichloride dichloromethane adduct were added, a resulting mixture was heated to 70° C., and a reaction was permitted for 24 hours. After termination of the reaction, a resulting reaction liquid was cooled to room temperature, and adding 300 g of methyl isobutyl ketone and 100 g of water gave a precipitate. The precipitate was collected on a paper filter and then dried to give the compound (a-7). The molecular weight of the compound (a-7) was 859.

Synthesis Example 16: Synthesis of Compound (a-8)

The compound (a-8) was obtained by an operation similar to that of Synthesis Example 15, except that 14.0 g of 1,6-dibromopyrene was used instead of 10.0 g of 1,3,6,8-tetrabromopyrene. The molecular weight of the compound (a-8) was 531.

Synthesis Example 17: Synthesis of Compound (A-10)

The compound (A-10) was obtained by an operation similar to that of Synthesis Example 11, except that 23 g of the compound (a-7) was used instead of 10.0 g of the compound (a-3). The molecular weight of the compound (A-10) was 1,163.

Synthesis Example 18: Synthesis of Compound (A-11)

The compound (A-11) was obtained by a similar operation to that of Synthesis Example 13, except that 10.0 g of the compound (a-8) and 5.88 g of 3-ethynylbenzaldehyde were used instead of 10.0 g of the compound (a-1) and 6.54 g of indole-3-carboxyaldehyde. The molecular weight of the compound (A-11) was 755.

Synthesis Example 19: Synthesis of Compound (A-12)

Into a reaction vessel were charged 10.0 g of the compound (a-3), 14.3 g of 1-formylpyrene, and 121.5 g of tetrahydrofuran in a nitrogen atmosphere, followed by stirring, and then 52.8 g of a 25% by mass aqueous tetramethylammonium hydroxide solution and 1.28 g of tetrabutylammonium bromide were added, and a reaction was permitted at 60° C. for 12 hours. After termination of the reaction, 500 g of a 5% by mass aqueous oxalic acid solution and 100 g of methyl isobutyl ketone were added. An aqueous layer was removed, followed by using water to conduct extraction by liquid separation, and then charging an organic layer into hexane to permit reprecipitation. The precipitate was collected on a paper filter and then dried to give the compound (A-12). The molecular weight of the compound (A-12) was 2,337.

Comparative Example 1: Synthesis of Compound (ca-1)

Into a reaction vessel were charged 20.0 g of 2-acetylfluorene and 20.0 g of m-xylene in a nitrogen atmosphere, followed by dissolving at 110° C. Next, 3.14 g of dodecylbenzenesulfonate was added thereto, a thus obtained solution was heated to 140° C., and a reaction was permitted for 16 hours. After termination of the reaction, into a resulting reaction solution was charged 80 g of xylene to perform dilution, followed by cooling to 50° C., and 500 g of methanol was charged to permit reprecipitation. The precipitate thus obtained was washed with toluene, and then a solid was collected on a filter paper and dried to give the compound (ca-1).

Comparative Example 2: Synthesis of Compound (CA-1)

Into a reaction vessel were charged 10.0 g of the compound (ca-1), 18.8 g of propargyl bromide, and 50 g of toluene, followed by stirring, and then 25.2 g of a 50% by mass aqueous sodium hydroxide solution and 1.7 g tetrabutylammonium bromide were charged, and a reaction was permitted at 92° C. for 12 hours. A resulting reaction liquid was cooled to 50° C., and then 25 g of tetrahydrofuran was added. An aqueous layer was removed, followed by adding 50 g of a 1% by mass aqueous oxalic acid solution to conduct extraction by liquid separation, and then charging into hexane to permit reprecipitation. The precipitate was collected on a paper filter and then dried to give the compound (CA-1). The molecular weight of the compound (CA-1) was 799.

Preparation of Composition

The solvent (B) used in preparation of the composition is as shown below.

(B) Solvent

B-1: propylene glycol monomethyl ether acetate
B-2: cyclohexanone

Example 1-1: Preparation of Composition (J-1)

10 parts by mass of (A-1) as the compound (A1) were dissolved in 90 parts by mass of (B-1) as the solvent (B), A resulting solution was filtered through a membrane filter having a pore size of 0.1 μm to prepare the composition (J-1).

Examples 1-2 to 1-12 and Comparative Example 1-1: Preparation of Compositions J-2 to J-12 and CJ-1

Compositions J-2 to J-12 and CJ-1 were prepared in a similar manner to Example 1, except that for each component, the type and content shown in Table 1 below were used.

TABLE 1

|  | Composition | (A) Compound | | (B) Solvent | |
|---|---|---|---|---|---|
|  |  | type | content (parts by mass) | type | content (parts by mass) |
| Example 1-1 | J-1 | A-1 | 10 | B-1 | 90 |
| Example 1-2 | J-2 | A-2 | 13 | B-1 | 87 |
| Example 1-3 | J-3 | A-3 | 13 | B-1 | 87 |
| Example 1-4 | J-4 | A-4 | 10 | B-2 | 90 |
| Example 1-5 | J-5 | A-5 | 10 | B-1 | 90 |
| Example 1-6 | J-6 | A-6 | 10 | B-2 | 90 |
| Example 1-7 | J-7 | A-7 | 10 | B-2 | 90 |
| Example 1-8 | J-8 | A-8 | 10 | B-2 | 90 |
| Example 1-9 | J-9 | A-9 | 10 | B-1 | 90 |
| Example 1-10 | J-10 | A-10 | 10 | B-2 | 90 |
| Example 1-11 | J-11 | A-11 | 10 | B-2 | 90 |
| Example 1-12 | J-12 | A-12 | 10 | B-2 | 90 |
| Comparative Example 1-1 | CJ-1 | CA-1 | 10 | B-1 | 90 |

Formation of Film

Examples 2-1 to 2-12 and Comparative Example 2-1

Each composition prepared as described above was applied on a silicon wafer (substrate) by a spin coating method using a spin coater ("LITMUS Pro Z," available from Tokyo Electron Limited). Next, heating was conducted at 400° C. for 60 seconds in an ambient air atmosphere and then cooled at 23° C. for 600 seconds to give a film-attached substrate having a film with an average thickness of 200 nm formed thereon.

Evaluations

The compositions prepared in "Preparation of Composition" and the film-attached substrates obtained in "Formation of Film" were evaluated by the following methods on the etching resistance, the heat resistance, and the embedding property. The evaluation results are shown together in Table 2 below.

Etching Resistance

The film on the film-attached substrate was treated in an etching apparatus ("TACTRAS," available from Tokyo Electron Limited) under conditions involving: $CF_4/Ar=110/440$ sccm, PRESS.=30 MT, HF RF (radiofrequency power for plasma production)=500 W, LF RF (radiofrequency power for bias)=3,000 W, DCS=−150 V, RDC (flow rate percentage at gas center)=50%, and 30 seconds. An etching rate (nm/minute) was calculated based on the average thickness of the film before the treatment and the average thickness of the film after the treatment. Next, with the etching rate of Comparative Example 2-1 being the standard, a ratio with respect to Comparative Example 2-1 was calculated, and determined as an index for etching resistance evaluation. The etching resistance was evaluated to be: "A" (extremely favorable) in a case in which the ratio was less than 0.90; "B" (favorable) in a case in which the ratio was no less than 0.90 and less than 1.00; and "C" (unfavorable) in a case in which the ratio was no less than 1.00. It is to be noted that in Table 2 below, "*" indicates being a standard for the etching resistance.

Heat Resistance

The film-attached substrate was further heated at 450° C. for 600 seconds in a nitrogen atmosphere, and then a treatment of cooling at 23° C. for 60 seconds was carried out. The average thicknesses of the film before the treatment and the film after the treatment were measured. The average thickness of the resist underlayer film before the treatment was designated as $X_0$ and the average thickness of the resist underlayer film after the treatment was designated as X, and the absolute value of a numerical value determined according to $(X-X_0) \times 100/X_0$ was calculated and defined as the rate of change of film thickness (%). The heat resistance was determined to be: "A" (extremely favorable) in a case of the rate of change of film thickness being less than 2%; "B" (favorable) in a case of being no less than 2% and less than 5%; and "C" (unfavorable) in a case of being no less than 5%.

Embedding Property

On a substrate having a line and space pattern with a depth of 100 nm and a width of 100 nm formed thereon, the composition was applied by a spin coating method using the spin coater. As spinning conditions of the spin coater, conditions similar to those in the case of obtaining the film-attached substrate having the film with the average thickness of 200 nm formed thereon were adopted. Next, heating was conducted at 400° C. for 60 seconds in an ambient air atmosphere, followed by cooling at 23° C. for 60 seconds. Next, a cross-sectional shape of the substrate was observed by using a scanning electron microscope ("S-4800," available from Hitachi High-Technologies Corporation), and an evaluation was conducted with regard to the embedding property. The embedding property was evaluated to be: "A" (favorable) in a case in which the film was embedded to a bottom part of the space pattern; and "B" (unfavorable) in a case in which the film was not embedded to the bottom part of the space pattern.

TABLE 2

| — | Composition | Etching resistance | Heat resistance | Embedding property |
|---|---|---|---|---|
| Example 2-1 | J-1 | A | A | A |
| Example 2-2 | J-2 | A | A | A |
| Example 2-3 | J-3 | A | A | A |
| Example 2-4 | J-4 | A | A | A |
| Example 2-5 | J-5 | B | B | A |
| Example 2-6 | J-6 | A | A | A |
| Example 2-7 | J-7 | A | A | A |
| Example 2-8 | J-8 | B | B | A |
| Example 2-9 | J-9 | B | A | A |
| Example 2-10 | J-10 | B | B | A |
| Example 2-11 | J-11 | A | A | A |
| Example 2-12 | J-12 | A | B | A |
| Comparative Example 2-1 | CJ-1 | * | C | A |

As is seen from the results in Table 2, compared to the films formed from the compositions of the Comparative Examples, the films formed from the compositions of the Examples were superior in terms of the etching resistance and the heat resistance. Furthermore, the compositions of the Examples were equal to the compositions of the Comparative Examples in terms of the embedding property.

The composition of the one embodiment of the present invention enables forming a film being superior in terms of the etching resistance, the heat resistance, and the embedding property. The resist underlayer film of the other embodiment of the present invention is superior in terms of the etching resistance, the heat resistance, and the embedding property. The method of forming a resist underlayer film of the still another embodiment of the present invention enables forming a resist underlayer film being superior in terms of the etching resistance, the heat resistance, and the embedding property. Due to forming a resist underlayer film being superior in terms of the etching resistance, the heat resistance, and the embedding property, the method of producing a patterned substrate of the yet another embodiment of the present invention enables obtaining a favorable patterned substrate. The compound of the further embodiment of the present invention can be suitably used as a component of a composition for forming a resist underlayer film. Thus, these can be suitably used in manufacturing of a semiconductor device and the like, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A method of producing a patterned substrate, the method comprising:
applying a resist-underlayer-film-forming composition directly or indirectly on a substrate to form a resist underlayer film;
forming a resist pattern directly or indirectly on the resist underlayer film; and
etching the substrate and the resist underlayer film using the resist pattern as a mask, wherein
the resist-underlayer-film-forming composition comprises:
a compound represented by at least one formula selected from the group consisting of formula (A1-1), formula (A1-2), formula (A1-3), formula (A1-4), formula (A1-5), formula (A1-6), formula (A1-7), and formula (A1-8); and
a solvent, wherein

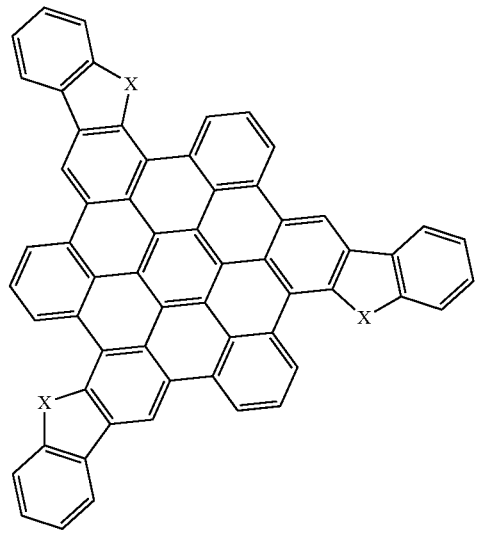

(A1-1)

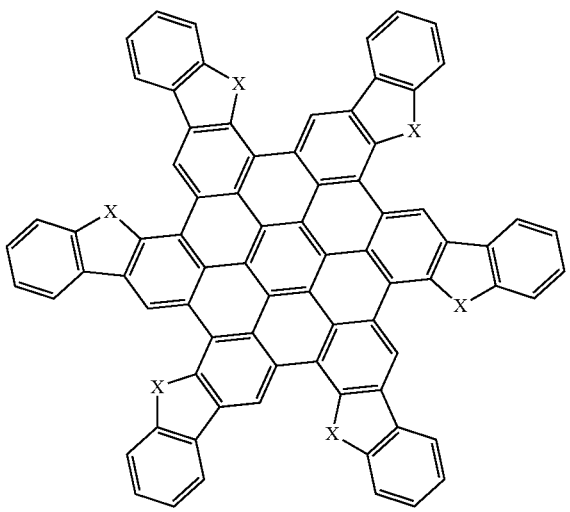

(A1-2)

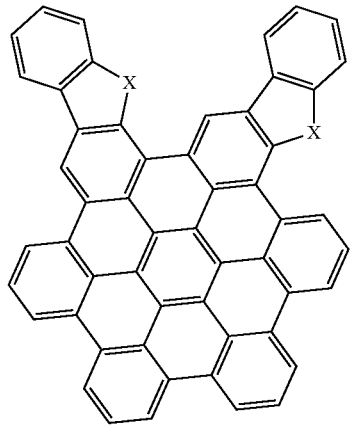

(A1-3)

(A1-4)

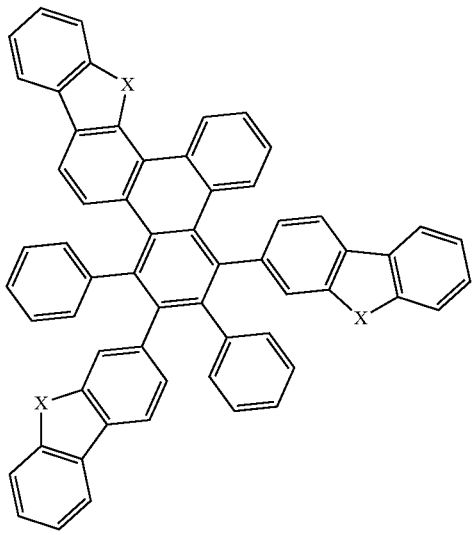

(A1-5)

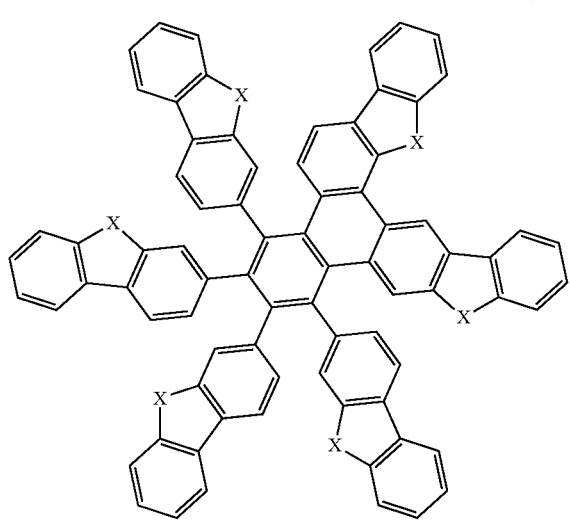

(A1-6)

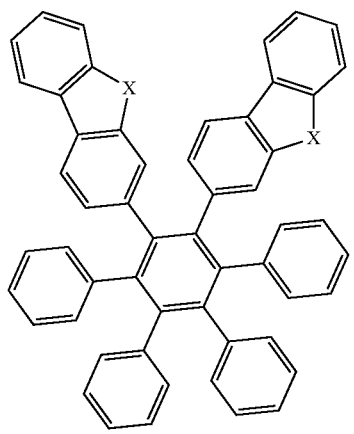

(A1-7)

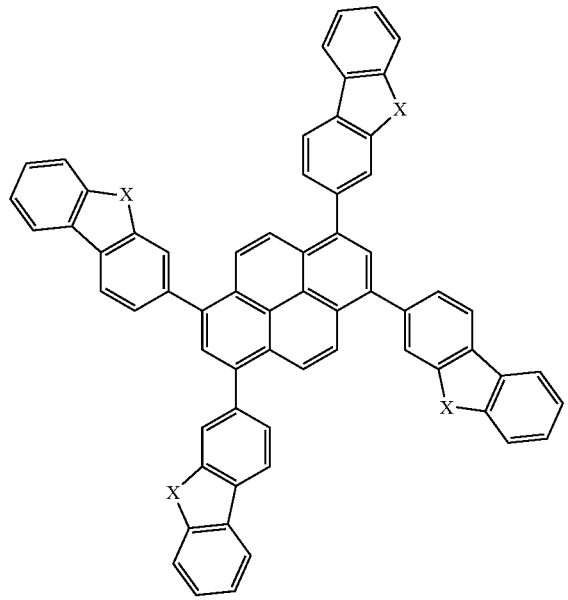

(A1-8)

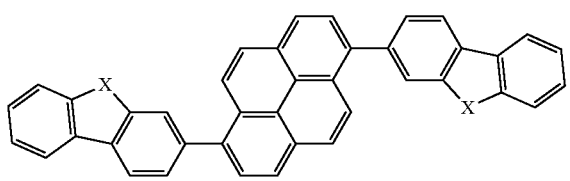

wherein, in the formulae (A1-1) to (A1-8), X represents a group represented by formula (i), (ii), (iii), or (iv),

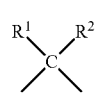 (i)

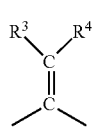 (ii)

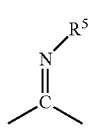 (iii)

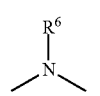 (iv)

wherein,
in the formula (i), $R^1$ represents a hydrogen atom or a monovalent organic group having 1 to 20 carbon atoms; and $R^2$ represents a monovalent organic group having 1 to 20 carbon atoms,
in the formula (ii), $R^3$ represents a hydrogen atom or a monovalent organic group having 1 to 20 carbon atoms; and $R^4$ represents a monovalent organic group having 1 to 20 carbon atoms, in the formula (iii), $R^5$ represents a monovalent organic group having 1 to 20 carbon atoms, in the formula (iv), $R^6$ represents a monovalent organic group having 1 to 20 carbon atoms, and the monovalent organic group having 1 to 20 carbon atoms represented by $R^1$, $R^2$, $R^3$, $R^4$, $R^5$, or $R^6$ is represented by at least one formula selected from the group consisting of formula (x-1), formula (x-2), formula (x-3), formula (x-4), formula (x-5), formula (x-6), formula (x-7), formula (x-8), formula (x-9), formula (x-10), formula (x-11), and formula (x-12):

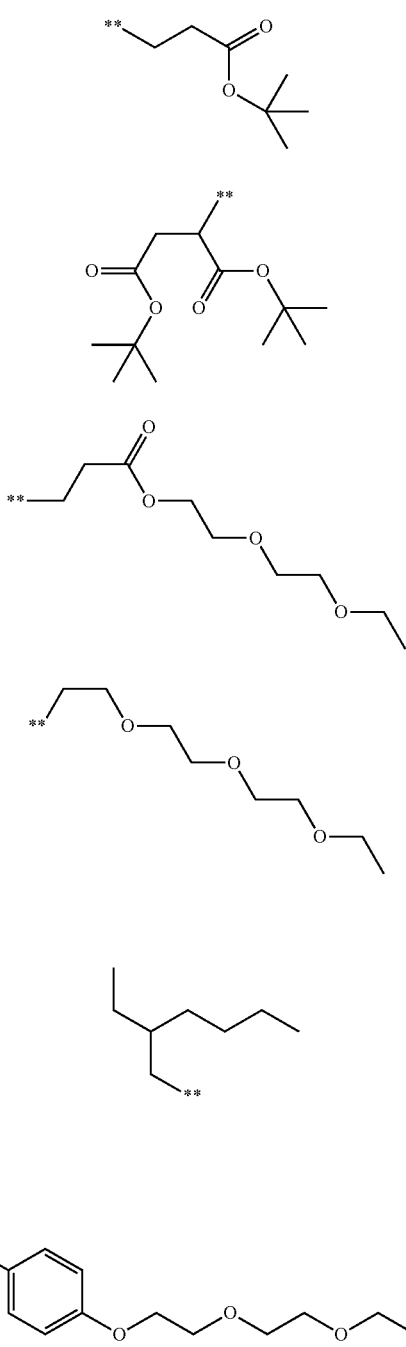

wherein ** denotes a site of bonding to the carbon atom or the nitrogen atom in the formula (i), (ii), (iii), or (iv).

2. The method according to claim 1, further comprising, before forming the resist pattern, forming a silicon-containing film directly or indirectly on the resist underlayer film such that the silicon-containing film is positioned between the resist underlayer film and the resist pattern, wherein etching comprises etching the substrate, the resist underlayer film, and the silicon-containing film using the resist pattern as a mask.

3. The method according to claim 1, wherein the compound is represented by at least one formula selected from the group consisting of formula (A1-1), formula (A1-2), and formula (A1-3).

4. The method according to claim 1, wherein X represents a group represented by the formula (i) or (ii).

5. The method according to claim 1, wherein the compound is represented by at least one formula selected from the group consisting of formula (A1-1), formula (A1-2), and formula (A1-3), and X represents a group represented by the formula (i) or (ii).

6. A composition comprising:

a compound represented by at least one formula selected from the group consisting of formula (A1-1), formula (A1-2), formula (A1-3), formula (A1-4), formula (A1-5), formula (A1-6), formula (A1-7), and formula (A1-8); and a solvent, wherein
(A1-1)
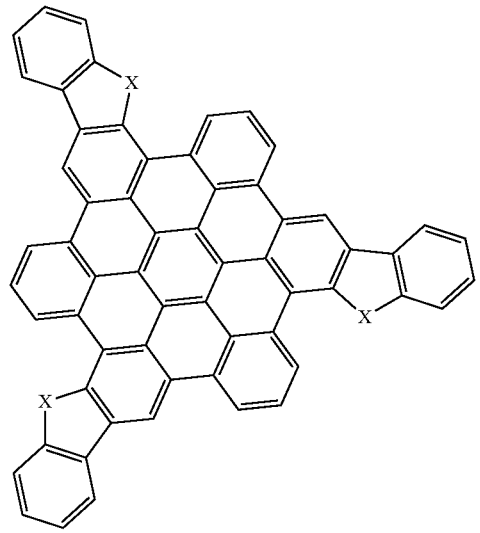
(A1-2)
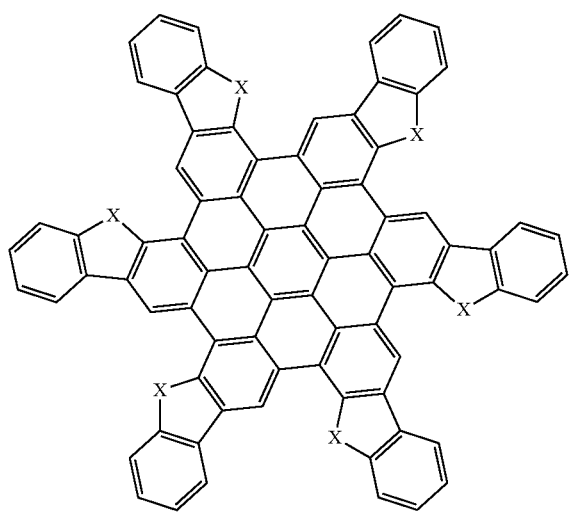
(A1-3)
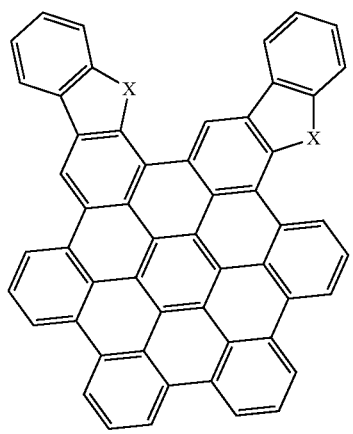
(A1-4)
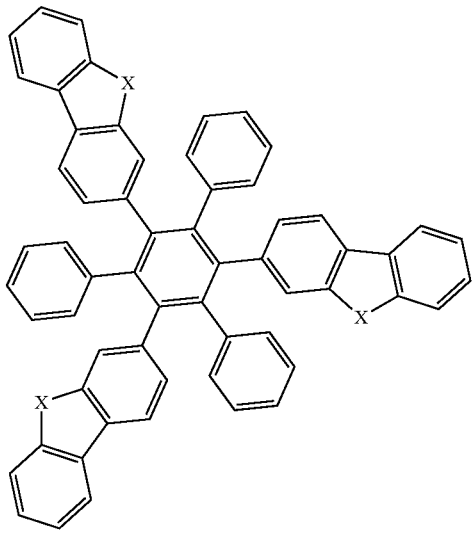
(A1-5)
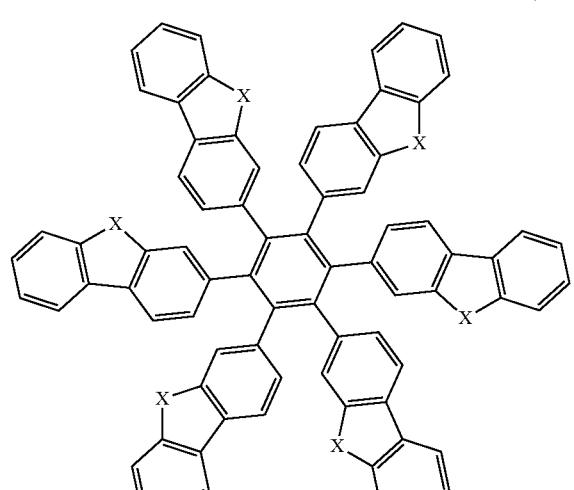
(A1-6)
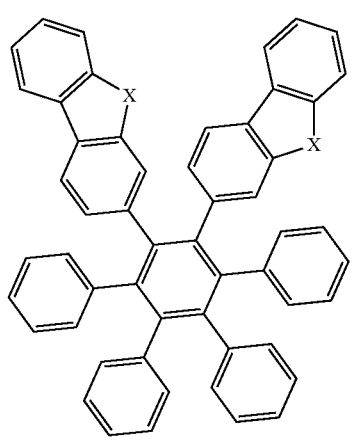

-continued (A1-7)

(A1-8)

wherein, in the formulae (A1-1) to (A1-8), X represents a group represented by formula (i) or (ii), (i)

(ii)

wherein,
in the formula (i), $R^1$ represents a hydrogen atom or a monovalent organic group having 1 to 20 carbon atoms; and $R^2$ represents a monovalent organic group having 1 to 20 carbon atoms,
in the formula (ii), $R^3$ represents a hydrogen atom or a monovalent organic group having 1 to 20 carbon atoms; and $R^4$ represents a monovalent organic group having 1 to 20 carbon atoms,
and
the monovalent organic group having 1 to 20 carbon atoms represented by $R^1$, $R^2$, $R^3$, or $R^4$ is represented by at least one formula selected from the group consisting of formula (x-1), formula (x-2), formula (x-3), formula (x-4), formula (x-5), formula (x-6), formula (x-7), formula (x-8), formula (x-9), formula (x-10), formula (x-11), and formula (x-12):

(x-1)

(x-2)

(x-3)

(x-4)

(x-5)

(x-6)

(x-7)

(x-8)

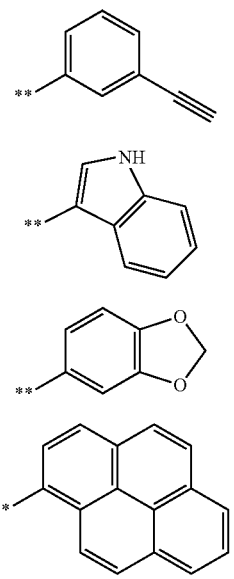

(x-9)

(x-10)

(x-11)

(x-12)

wherein ** denotes a site of bonding to the carbon atom or the nitrogen atom in the formula (i) or (ii).

7. The composition according to claim 6, wherein the compound is represented by at least one formula selected from the group consisting of formula (A1-1), formula (A1-2), and formula (A1-3).

8. The composition according to claim 6, which is suitable for forming a resist underlayer film.

9. A resist underlayer film formed from the composition according to claim 6.

10. A method of forming a film, the method comprising:
   applying the composition according to claim 6 directly or indirectly on a substrate; and
   drying the composition.

11. A compound represented by at least one formula selected from the group consisting of formula (A2-1), formula (A2-2), formula (A2-3), formula (A2-4), formula (A2-5), formula (A2-6), formula (A2-7), and formula (A2-8):

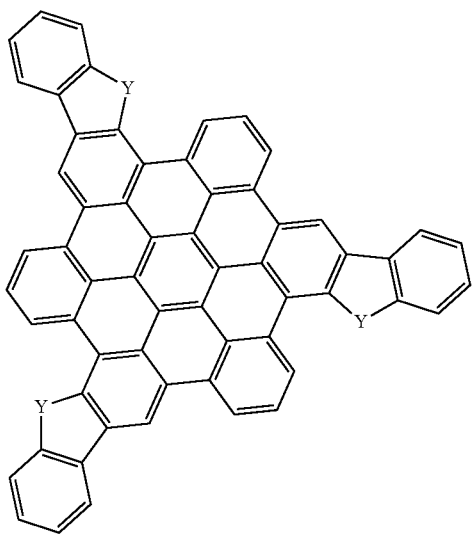

(A2-1)

(A2-2)

(A2-3)

(A2-4)

(A2-5)

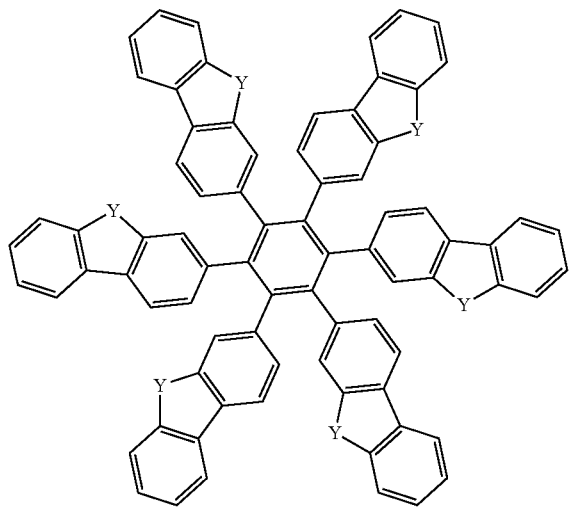

(A2-6)

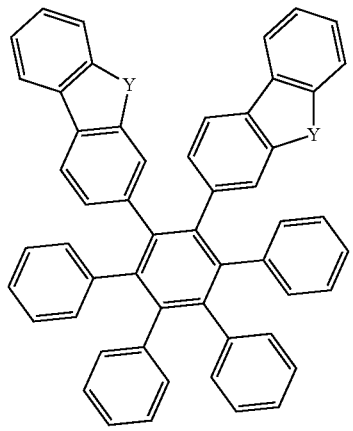

(A2-7)

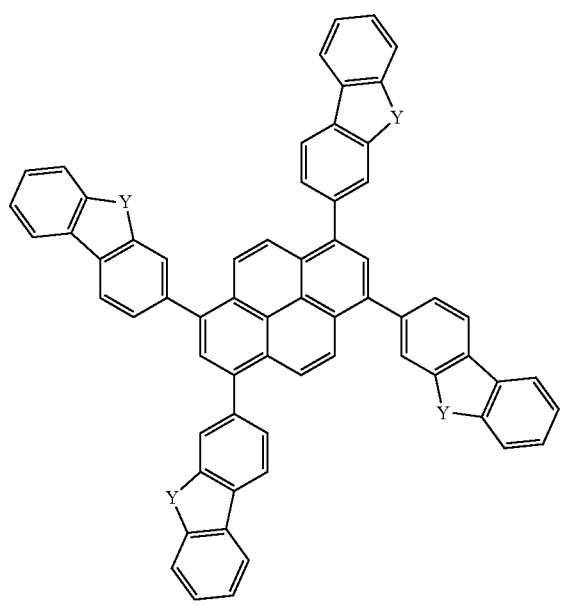

(A2-8)

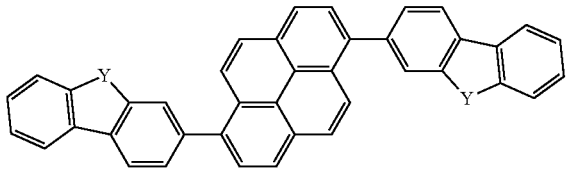

wherein, in the formulae (A2-1) to (A2-8), Y represents a group represented by formula (v) or,

(v)

wherein,
in the formula (v), $R^7$ and $R^8$ each independently represent a hydrogen atom or a monovalent organic group having 1 to 20 carbon atoms,
and
the monovalent organic group having 1 to 20 carbon atoms represented by $R^7$ or $R^8$ is represented by at least one formula selected from the group consisting of formula (x-1), formula (x-2), formula (x-3), formula (x-4), formula (x-5), formula (x-6), formula (x-7), formula (x-8), formula (x-9), formula (x-10), formula (x-11), and formula (x-12):

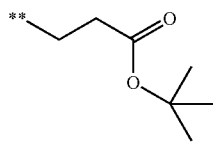
(x-1)

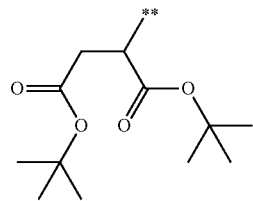
(x-2)

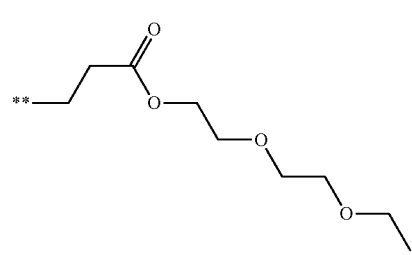
(x-3)

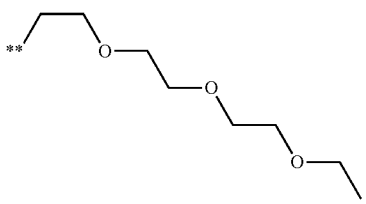
(x-4)

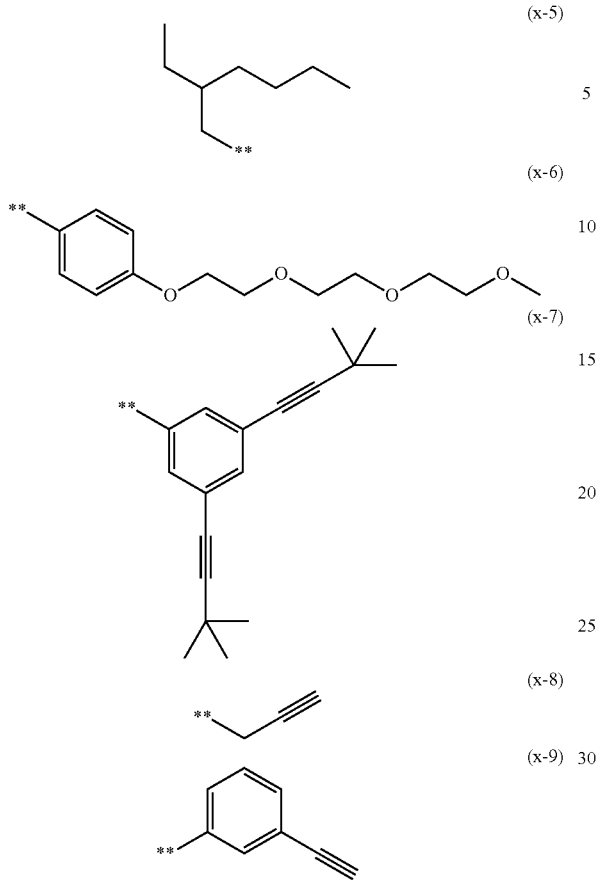
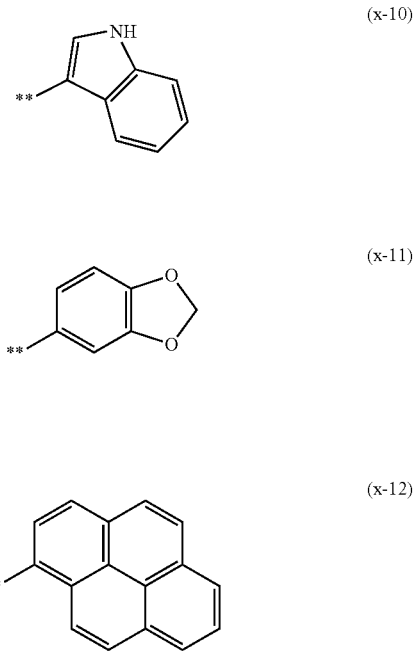
wherein ** denotes a site of bonding to the carbon atom or the nitrogen atom in the formula (v).
12. The compound according to claim 11, wherein the compound is represented by at least one formula selected from the group consisting of formula (A2-1), formula (A2-2), and formula (A2-3).
* * * * *